US010312244B2

(12) United States Patent
Li et al.

(10) Patent No.: US 10,312,244 B2
(45) Date of Patent: Jun. 4, 2019

(54) BI-STABLE STATIC RANDOM ACCESS MEMORY (SRAM) BIT CELLS THAT FACILITATE DIRECT WRITING FOR STORAGE

(71) Applicant: QUALCOMM Incorporated, San Diego, CA (US)

(72) Inventors: Xia Li, San Diego, CA (US); Seung Hyuk Kang, San Diego, CA (US); Bin Yang, San Diego, CA (US); Gengming Tao, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/708,913

(22) Filed: Sep. 19, 2017

(65) Prior Publication Data

US 2019/0088660 A1    Mar. 21, 2019

(51) Int. Cl.
  *H01L 27/11*    (2006.01)
  *H01L 29/08*    (2006.01)
  (Continued)

(52) U.S. Cl.
  CPC ........ *H01L 27/1104* (2013.01); *G11C 11/419* (2013.01); *H01L 21/0273* (2013.01); *H01L 21/30604* (2013.01); *H01L 21/31053* (2013.01); *H01L 21/76224* (2013.01); *H01L 29/0649* (2013.01); *H01L 29/0657* (2013.01); *H01L 29/0804* (2013.01); *H01L 29/0821* (2013.01);
  (Continued)

(58) Field of Classification Search
  CPC ............. H01L 27/1104; H01L 29/1095; H01L 29/0847; H01L 29/0804; H01L 29/1004; H01L 29/42304; H01L 29/0657; H01L 29/0821; H01L 29/41708; H01L 27/0705
  See application file for complete search history.

(56) References Cited

U.S. PATENT DOCUMENTS 5,243,206 A    9/1993  Zhu et al.
5,561,306 A    10/1996 Imamura et al.
(Continued)

OTHER PUBLICATIONS

Author Unknown, "Compound Semiconductor: Connecting the Compound Semiconductor Community," vol. 22, Issue 3, Apr. 2016, Compound Semiconductor, 72 pages.
(Continued)

*Primary Examiner* — Jarrett J Stark
(74) *Attorney, Agent, or Firm* — W&T/Qualcomm

(57) ABSTRACT

Bi-stable static random access memory (SRAM) bit cells that facilitate direct writing for storage are disclosed. In one aspect, a bi-stable SRAM bit cell includes source and drain regions, and a gate region formed over a well region between the source and drain regions, which results in two (2) bipolar junction transistors (BJTs) formed within a bi-stable SRAM bit cell. A base tap region and a collector tap region are employed to provide voltages for read and write operations. The base tap region is formed beside a shallow trench isolation (STI) region having a bottom surface higher in a Y-axis direction in the well region than a bottom surface of the well region. The collector tap region is formed on one side of an STI region having a bottom surface lower in the Y-axis direction in the substrate than the bottom surface of the well region.

20 Claims, 18 Drawing Sheets

(51) Int. Cl.
  *H01L 29/10* (2006.01)
  *H01L 29/06* (2006.01)
  *H01L 29/423* (2006.01)
  *H01L 29/417* (2006.01)
  *H01L 29/165* (2006.01)
  *H01L 29/16* (2006.01)
  *H01L 21/762* (2006.01)
  *H01L 21/027* (2006.01)
  *H01L 21/306* (2006.01)
  *H01L 21/3105* (2006.01)
  *G11C 11/419* (2006.01)
  *H01L 27/07* (2006.01)

(52) U.S. Cl.
  CPC ...... *H01L 29/0847* (2013.01); *H01L 29/1004* (2013.01); *H01L 29/1079* (2013.01); *H01L 29/1095* (2013.01); *H01L 29/165* (2013.01); *H01L 29/1608* (2013.01); *H01L 29/41708* (2013.01); *H01L 29/42304* (2013.01); *H01L 27/0705* (2013.01)

(56) References Cited

U.S. PATENT DOCUMENTS

| | | | |
|---|---|---|---|
| 5,563,087 A | 10/1996 | Shen et al. | |
| 5,864,152 A | 1/1999 | Mori | |
| 5,945,713 A | 8/1999 | Voldman | |
| 8,077,536 B2 | 12/2011 | Widjaja | |
| 8,130,547 B2 | 3/2012 | Widjaja et al. | |
| 8,582,359 B2 | 11/2013 | Widjaja | |
| 8,837,204 B2 * | 9/2014 | Asa | G11C 11/411 365/154 |
| 9,001,581 B2 | 4/2015 | Widjaja | |
| 9,208,880 B2 * | 12/2015 | Louie | G11C 15/04 |
| 9,368,625 B2 * | 6/2016 | Louie | H01L 21/26586 |
| 9,496,053 B2 | 11/2016 | Han et al. | |
| 9,536,595 B2 | 1/2017 | Louie et al. | |
| 9,601,493 B2 * | 3/2017 | Widjaja | H01L 27/10802 |
| 10,186,514 B1 * | 1/2019 | Tao | H01L 27/1104 |
| 2003/0047750 A1 | 3/2003 | Russ et al. | |
| 2005/0179093 A1 * | 8/2005 | Morris | H01L 21/761 257/371 |
| 2008/0253046 A1 | 10/2008 | Lou et al. | |
| 2012/0012915 A1 | 1/2012 | Widjaja et al. | |
| 2012/0018804 A1 | 1/2012 | Khemka et al. | |
| 2013/0015517 A1 * | 1/2013 | Widjaja | G11C 11/404 257/316 |
| 2013/0100559 A1 | 4/2013 | Kuenemund et al. | |
| 2013/0166990 A1 * | 6/2013 | Morris | G06F 11/0793 714/764 |
| 2013/0264656 A1 | 10/2013 | Widjaja et al. | |
| 2013/0320458 A1 * | 12/2013 | Deng | H01L 27/1104 257/390 |
| 2015/0091054 A1 | 4/2015 | Su et al. | |
| 2016/0173081 A1 | 6/2016 | Pan et al. | |
| 2016/0343701 A1 | 11/2016 | Zhong et al. | |

OTHER PUBLICATIONS

Kursun, Volkan, "Body Effect Model and Reverse and Forward Body Bias," ELEC 301: CMOS VLSI Design, Hong Kong University of Science and Technology, available at least as early as Aug. 30, 2017, 6 pages.

Moyer, Bryon, "A 1T (or 2T) SRAM Bit Cell: Significant Change to SRAM Economics?" Electronic Engineering Journal, Jan. 4, 2016, 8 pages, https://www.eejournal.com/article/20160104-zeno/.

Rajagopalan, Karthik et al., "Compound Semiconductor MOSFET Structure With High-K Dielectric," CS Mantech Conference, Apr. 24-27, 2006, Vancouver, Canada, pp. 119-121.

Watanabe, Y. et al., "Monolithic Integration of InGaAs/InAlAs Resonant Tunneling Diode and HEMT for Single-Transistor Cell Sram Application", IEEE, International Electron Devices Meeting (IEDM), 1992, pp. 475-478.

Ye, P.D. et al., "GaAs metal-oxide-semiconductor field-effect transistor with nanometer-thin dielectric grown by atomic layer deposition," Applied Physics Letters, vol. 83, No. 1, Jul. 7, 2003, American Institute of Physics, 3 pages.

Han, Jin-Woo et al., "A Novel Bi-Stable 1-Transistor SRAM for High Density Embedded Applications," 2015 IEEE International Electron Devices Meeting (IEDM), Dec. 7, 2015, 4 pages.

Karda, Kamal et al., "One-Transistor Bistable-Body Tunnel SRAM," IEEE International Conference on IC Design and Technology, ICICDT '09, May 18, 2009, pp. 233-236.

Yadava, Narendra et al., "Design of One-Transistor SRAM Cell for Low Power Consumption," International Conference on Emerging Trends in Electrical, Electronics and Sustainable Energy Systems (ICETEESES-16), Mar. 11, 2016, pp. 322-325.

* cited by examiner

| | W0 | W1 | Read | Stand-by |
|---|---|---|---|---|
| Select WL | 0V | 0V | Vdd/2 | Vdd |
| Select BL | Vdd+0.5V | Vdd-0.7V | Vdd-0.2V | Vdd |
| Select SL | Vdd+0.5V | Vdd | Vdd | Vdd |
| Unselect WL | Vdd | Vdd | Vdd | Vdd |
| Unselect BL | Vdd | Vdd | Vdd | Vdd |
| Unselect SL | Vdd | Vdd | Vdd | Vdd |
| CT | 0V | 0V | 0V | 0V |

FIG. 10

BI-STABLE STATIC RANDOM ACCESS MEMORY (SRAM) BIT CELLS THAT FACILITATE DIRECT WRITING FOR STORAGE

BACKGROUND

I. Field of the Disclosure

The technology of the disclosure relates generally to static random access memory (SRAM) bit cells, and more particularly to bi-stable SRAM bit cells.

II. Background

Processor-based computer systems include memory for data storage. Different types of memory exist, each possessing certain unique features. For example, static random access memory (SRAM) is a type of memory that can be employed in processor-based computer systems. SRAM can store data without the need to periodically refresh the memory, unlike dynamic random access memory (DRAM) for example. An SRAM contains a plurality of SRAM bit cells (also referred to as "bit cells") organized in rows and columns in an SRAM data array. For any given row in an SRAM data array, each column of the SRAM array includes an SRAM bit cell in which a single data value or bit is stored. Read and write operations are performed on a particular SRAM bit cell using read and write word lines which correspond to the SRAM bit cell row that includes the particular SRAM bit cell. Further, each SRAM bit cell conventionally includes six (6) transistors (i.e., 6T SRAM bit cell), wherein four (4) transistors are used to form cross-coupled inverters for storing the data value, and two (2) transistors are used to access the cross-coupled inverters for read and write operations.

In an effort to reduce the area consumption of SRAM data arrays, SRAM bit cells with fewer than six (6) transistors have been introduced over time. FIG. 1 illustrates a conventional one transistor (1T) N-type metal-oxide semiconductor (MOS) (NMOS) bi-stable SRAM bit cell 100. In particular, the 1T NMOS bi-stable SRAM bit cell 100 includes a single NMOS transistor 102 employing a source region 104, a drain region 106, and a gate region 108. The gate region 108 includes a gate oxide layer 110, a metal gate 112 disposed over the gate oxide layer 110, and spacers 114(1), 114(2) disposed on either side of the gate oxide layer 110 and the metal gate 112. A source line SL is coupled to the source region 104, a bit line BL is coupled to the drain region 106, and a word line WL is coupled to the gate region 108. Additionally, the NMOS transistor 102 includes a buried N-type well (N-well) 116 disposed over a P-type substrate (P-substrate) 118 such that a floating P-type well (P-well) 120 is formed between the source region 104 and the drain region 106. Further, shallow trench isolation (STI) regions 122(1), 122(2) are formed on either side of the floating P-well 120. A control line CL is coupled to an N-well tap 124 that is electrically coupled to the buried N-well 116 such that a bias voltage $V_{BIAS}$ may be applied to the buried N-well 116.

Designing the 1T NMOS bi-stable SRAM bit cell 100 as illustrated in FIG. 1 results in a bipolar junction transistor (BJT) 126(1) being formed from the source region 104, the floating P-well 120, and the buried N-well 116. In particular, the floating P-well 120 functions as a base B1, the source region 104 functions as an emitter E1, and the buried N-well 116 functions as a collector C1 of the BJT 126(1). Similarly, a BJT 126(2) is formed from the drain region 106, the floating P-well 120, and the buried N-well 116. The floating P-well 120 functions as a base B2, the drain region 106 functions as an emitter E2, and the buried N-well 116 functions as a collector C2 of the BJT 126(2). In this manner, a data value stored in the 1T NMOS bi-stable SRAM bit cell 100 corresponds to voltage potential (i.e., a number of carriers (i.e., holes) present) in the floating P-well 120. Thus, the 1T NMOS bi-stable SRAM bit cell 100 can be read from or written to according to the voltages applied via the source line SL, the word line WL, the bit line BL, and the control line CL. In particular, to read the 1T NMOS bi-stable 1T SRAM bit cell 100, a voltage is applied to the word line WL to activate the NMOS transistor 102. A data value "1" is read out onto the bit line BL if a particular charge is stored in the floating P-well 120, and a data value "0" is read out onto the bit line BL if there is no stored charge, or if the stored charge is below a threshold. To write a data value "1," a voltage is applied to the word line WL to activate the NMOS transistor 102 while a positive voltage is applied to the control line CL. In response to the positive voltage applied to the control line CL, an ionization electron-hole pair is generated at a PN junction 128 corresponding to the buried N-well 116 (i.e., N) and the floating P-well 120 (i.e., P) as a result of capacitive coupling such that hole carriers flow into the floating P-well 120 through the collectors C1, C2. To write a data value "0," a voltage is applied to the word line WL to activate the NMOS transistor 102 while a negative charge pump provides a negative voltage to the source line SL, such that hole carriers are drained from the floating P-well 120 through the emitter E1 of the BJT 126(1), which is in a forward junction state.

Although the 1T NMOS bi-stable SRAM bit cell 100 consumes less area than a conventional 6T SRAM bit cell, the 1T NMOS bi-stable SRAM bit cell 100 is not without its limitations. For example, the 1T NMOS bi-stable SRAM bit cell 100 requires a unique N-well implantation step to implement the buried N-well 116, thus necessitating an additional processing step not employed in conventional transistor fabrication. Additionally, the 1T NMOS bi-stable SRAM bit cell 100 suffers from relatively slow junction leakage corresponding to the BJTs 126(1), 126(2), which increases power consumption. Further, the 1T NMOS bi-stable SRAM bit cell 100 has a relatively slow write speed, because write operations require electron-hole generation in the floating P-well 120 through the buried N-well 116, as well as a negative charge pump to write a data value "0."

SUMMARY OF THE DISCLOSURE

Aspects disclosed in the detailed description include bi-stable static random access memory (SRAM) bit cells that facilitate direct writing for storage. In one aspect, a bi-stable SRAM bit cell includes a substrate and a well region formed in the substrate. The bi-stable SRAM bit cell also includes separate source and drain regions formed adjacent to the well region, and a gate region formed over the well region between the source region and the drain region. In other words, the bi-stable SRAM bit cell in this aspect is formed using one (1) metal-oxide semiconductor (MOS) transistor. Employing such elements results in two (2) bipolar junction transistors (BJTs) formed within the bi-stable SRAM bit cell. In particular, one BJT is formed from junctions between the source and well regions, and between the well region and substrate, while another BJT is formed from junctions between the drain region and well region, and between the well region and substrate. Additionally, the bi-stable SRAM bit cell employs shallow trench isolation (STI) regions having a bottom surface lower in a Y-axis direction in the substrate than the well region and formed on either side of the well region. Forming the STI regions in this manner electrically isolates the well region from adjacent elements, such as adjacent MOS devices. Electrically isolating the well region allows a charge to be stored in the well region, wherein such a charge corresponds to a data value of the bi-stable SRAM bit cell.

Additionally, the bi-stable SRAM bit cell employs a base tap region and a collector tap region to provide voltages for read and write operations. More specifically, the base tap region is formed between one STI region having a bottom surface lower in the Y-axis direction in the substrate than the bottom surface of the well region, and another STI region having a bottom surface higher in the Y-axis direction in the well region than the bottom surface of the well region. Forming the base tap region in this manner results in a voltage applied to the base tap region being provided directly to the well region, which corresponds to a base of each BJT. The collector tap region is formed on one side of an STI region having a bottom surface lower in the Y-axis direction in the substrate than the bottom surface of the well region. Forming the collector tap region in this manner results in a voltage applied to the collector tap region being provided to a collector of each BJT. Providing voltages directly to the BJT bases and collectors in this manner allows the bi-stable SRAM bit cell to charge the well region without traversing through an additional layer as in a conventional bi-stable SRAM bit cell, thus allowing for faster direct writing.

In this regard in one aspect, a bi-stable SRAM bit cell is provided. The bi-stable SRAM bit cell comprises a substrate and a well region formed in the substrate. The bi-stable SRAM bit cell further comprises a source region formed adjacent to the well region, wherein a first BJT is formed that comprises a base corresponding to the well region, a collector corresponding to the substrate, and an emitter corresponding to the source region. The bi-stable SRAM bit cell further comprises a drain region formed adjacent to the well region a distance from the source region, wherein a second BJT is formed that comprises a base corresponding to the well region, a collector corresponding to the substrate, and an emitter corresponding to the drain region. The bi-stable SRAM bit cell also comprises a gate region formed over the well region between the source region and the drain region, a base tap region formed adjacent to the well region, and a collector tap region formed adjacent to the substrate. The bi-stable SRAM bit cell further comprises an STI region formed in the substrate adjacent to a first side of the well region and the source region. A bottom surface of the first STI region is lower in the substrate than a bottom surface of the well region. The bi-stable SRAM bit cell further comprises a second STI region formed in the substrate between the base tap region and the collector tap region and adjacent to a second side of the well region and the drain region. A bottom surface of the second STI region is lower in the substrate than the bottom surface of the well region. The bi-stable SRAM bit cell also comprises a third STI region formed in the substrate between the drain region and the base tap region. A bottom surface of the third STI region is higher in the well region than the bottom surface of the well region.

In another aspect, a bi-stable SRAM bit cell is provided. The bi-stable SRAM bit cell comprises a source electrode, a drain electrode, and a gate electrode electrically coupled to a word line. The bi-stable SRAM bit cell further comprises a base tap electrode, and a collector tap electrode configured to receive a collector tap voltage.

In another aspect, an SRAM data array is provided that comprises a plurality of bi-stable SRAM bit cells organized into a plurality of SRAM bit cell rows and a plurality of SRAM bit cell columns. Each bi-stable SRAM bit cell of the plurality of bi-stable SRAM bit cells corresponds to an SRAM bit cell row and an SRAM bit cell column. Each bi-stable SRAM bit cell comprises a substrate and a well region formed in the substrate. Each bi-stable SRAM bit cell further comprises a source region formed adjacent to the well region, wherein a first BJT is formed that comprises a base corresponding to the well region, a collector corresponding to the substrate, and an emitter corresponding to the source region. Each bi-stable SRAM bit cell further comprises a drain region formed adjacent to the well region a distance from the source region, wherein a second BJT is formed that comprises a base corresponding to the well region, a collector corresponding to the substrate, and an emitter corresponding to the drain region. Each bi-stable SRAM bit cell further comprises a gate region formed over the well region between the source region and the drain region, a base tap region formed adjacent to the well region, and a collector tap region formed adjacent to the substrate. Each bi-stable SRAM bit cell also comprises a first STI region formed in the substrate adjacent to a first side of the well region and the source region. A bottom surface of the first STI region is lower in the substrate than a bottom surface of the well region. Each bi-stable SRAM bit cell further comprises a second STI region formed in the substrate between the base tap region and the collector tap region and adjacent to a second side of the well region and the drain region. A bottom surface of the second STI region is lower in the substrate than the bottom surface of the well region. Each bi-stable SRAM bit cell further comprises a third STI region formed in the substrate between the drain region and the base tap region. A bottom surface of the third STI region is higher in the well region than the bottom surface of the well region.

In another aspect, a method for manufacturing a bi-stable SRAM bit cell is provided. The method comprises forming a first STI region, a second STI region, and a third STI region. A bottom surface of the first STI region and a bottom surface of the second STI region is lower in a substrate than a bottom surface of the third STI region. The method also comprises doping the substrate to form a well region such that a bottom surface of the well region is higher in the substrate than the bottom surfaces of the first STI region and the second STI region, and lower in the substrate than the bottom surface of the third STI region. The method also comprises forming a gate region over the well region between the first STI region and the third STI region. The method further comprises forming a source region adjacent to the well region between the first STI region and the gate region, wherein a first BJT is formed that comprises a base corresponding to the well region, a collector corresponding to the substrate, and an emitter corresponding to the source region. The method further comprises forming a drain region adjacent to the well region between the third STI region and the gate region, wherein a second BJT is formed that comprises a base corresponding to the well region, a collector corresponding to the substrate, and an emitter corresponding to the drain region. The method further comprises forming a base tap region adjacent to the well region between the second STI region and the third STI region. The method also comprises forming a collector tap region adjacent to the substrate adjacent to the second STI region.

BRIEF DESCRIPTION OF THE FIGURES

FIG. 10 is a table illustrating exemplary voltages to apply to the exemplary SRAM data array employing bi-stable SRAM bit cells that facilitate direct writing for storage of FIG. 9;

DETAILED DESCRIPTION

Figure 1:
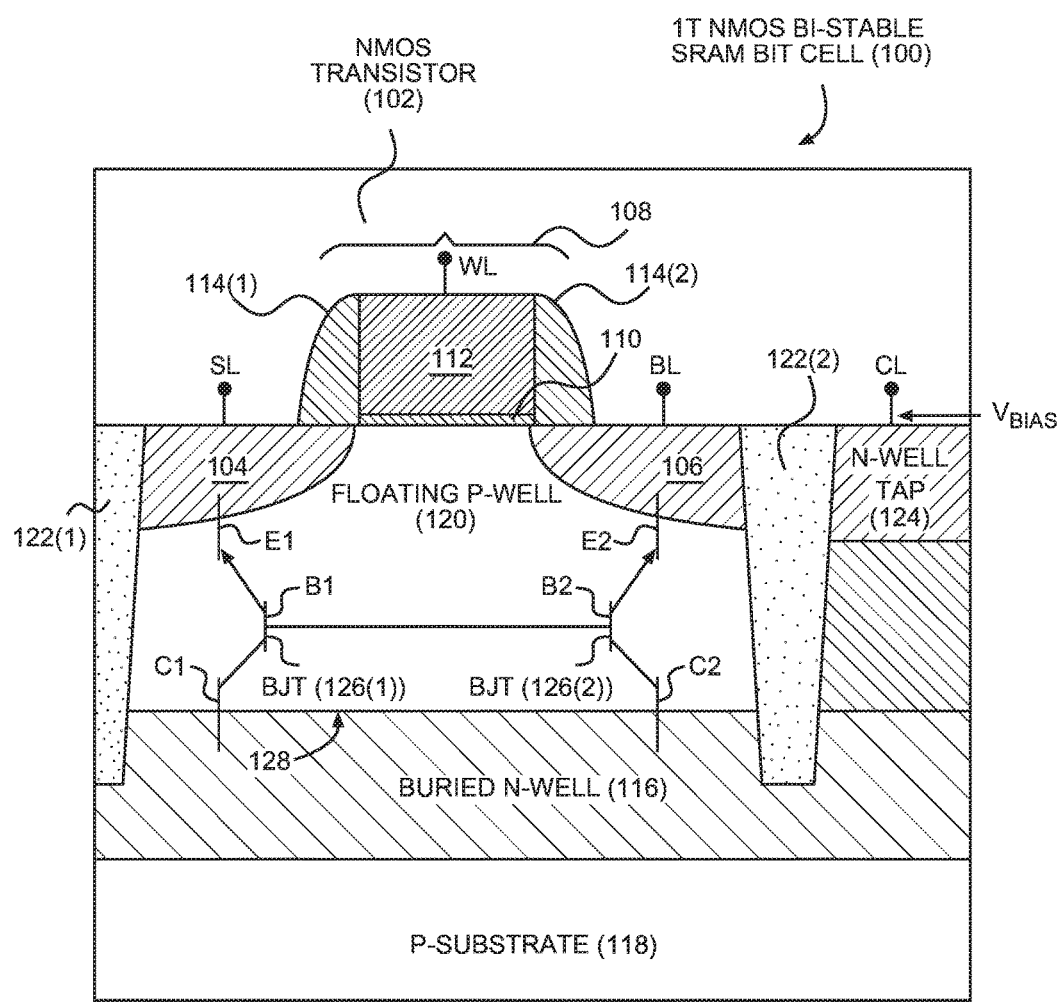
FIG. 1 is a cross-sectional diagram of a conventional one transistor (1T) N-type metal-oxide semiconductor (MOS) (NMOS) bi-stable static random access memory (SRAM) bit cell configured to achieve indirect writing through a buried N-type well (N-well) region.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include bi-stable static random access memory (SRAM) bit cells that facilitate direct writing for storage. In one aspect, a bi-stable SRAM bit cell includes a substrate and a well region formed in the substrate. The bi-stable SRAM bit cell also includes separate source and drain regions formed adjacent to the well region, and a gate region formed over the well region between the source region and the drain region. In other words, the bi-stable SRAM bit cell in this aspect is formed using one (1) metal-oxide semiconductor (MOS) transistor. Employing such elements results in two (2) bipolar junction transistors (BJTs) formed within the bi-stable SRAM bit cell. In particular, one BJT is formed from junctions between the source and well regions, and between the well region and substrate, while another BJT is formed from junctions between the drain region and well region, and between the well region and substrate. Additionally, the bi-stable SRAM bit cell employs shallow trench isolation (STI) regions having a bottom surface lower in a Y-axis direction in the substrate than the well region and formed on either side of the well region. Forming the STI regions in this manner electrically isolates the well region from adjacent elements, such as adjacent MOS devices. Electrically isolating the well region allows a charge to be stored in the well region, wherein such a charge corresponds to a data value of the bi-stable SRAM bit cell.

Additionally, the bi-stable SRAM bit cell employs a base tap region and a collector tap region to provide voltages for read and write operations. More specifically, the base tap region is formed between one STI region having a bottom surface lower in the Y-axis direction in the substrate than the bottom surface of the well region, and another STI region having a bottom surface higher in the Y-axis direction in the well region than the bottom surface of the well region. Forming the base tap region in this manner results in a voltage applied to the base tap region being provided directly to the well region, which corresponds to a base of each BJT. The collector tap region is formed on one side of an STI region having a bottom surface lower in the Y-axis direction in the substrate than the bottom surface of the well region. Forming the collector tap region in this manner results in a voltage applied to the collector tap region being provided to a collector of each BJT. Providing voltages directly to the BJT bases and collectors in this manner allows the bi-stable SRAM bit cell to charge the well region without traversing through an additional layer as in a conventional bi-stable SRAM bit cell, thus allowing for faster direct writing.

Figure 2:
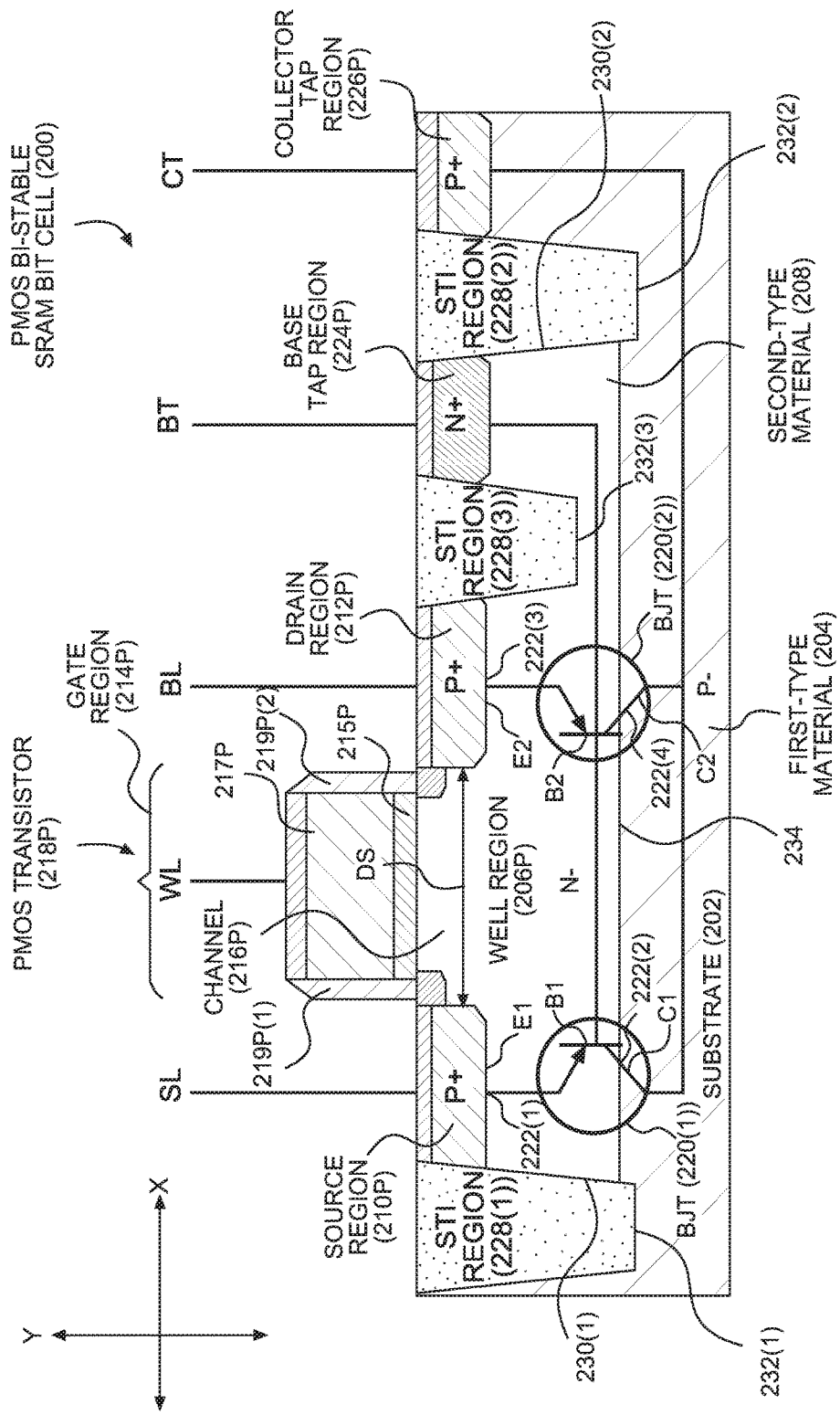
FIG. 2 is a cross-sectional diagram of an exemplary P-type MOS (PMOS) bi-stable SRAM bit cell that facilitates direct writing for storage.

In this regard, FIG. 2 is a cross-sectional diagram of an exemplary bi-stable SRAM bit cell 200 that facilitates direct writing for storage. In particular, the bi-stable SRAM bit cell 200 is employed as a P-type MOS (PMOS) bi-stable SRAM bit cell 200. However, details of an N-type MOS (NMOS) bi-stable SRAM bit cell are described below starting in FIG. 6.

With continuing reference to FIG. 2, the PMOS bi-stable SRAM bit cell 200 includes a substrate 202 of a first-type material 204 and a well region 206 (also referred to as well region 206P) formed by doping the substrate 202 with a second-type material 208. As a non-limiting example, the first-type material 204 in this aspect is a P-type material (P−) 204 and the second-type material 208 is an N-type material (N−) 208. The PMOS bi-stable SRAM bit cell 200 also includes a source region 210 and a drain region 212 (also referred to as source region 210P and drain region 212P, respectively) formed adjacent to the well region 206P (e.g., buried in the well region 206P), wherein the drain region 212P is formed a distance DS in an X-axis direction (X) from the source region 210P. In this aspect, the source and drain regions 210P, 212P are both formed from a P-type material (P+) such as silicon-germanium (SiGe) or silicon (Si). Additionally, a gate region 214 (also referred to as gate region 214P) is formed over the well region 206P between the source and drain regions 210P, 212P such that a channel 216 (also referred to as channel 216P) is formed in the well region 206P corresponding to the gate region 214P. In this aspect, the gate region 214P includes a gate oxide layer 215P disposed over the well region 206P, a metal gate 217P disposed over the gate oxide layer 215P, wherein the gate oxide layer 215P and the metal gate 217P are disposed between spacers 219P(1), 219P(2). In other words, the PMOS bi-stable SRAM bit cell 200 in this aspect is formed using one (1) PMOS transistor 218P. Employing such elements results in two (2) bipolar junction transistors (BJTs) 220(1), 220(2) (e.g., PNP BJTs 220(1), 220(2)) formed within the PMOS bi-stable SRAM bit cell 200. In particular, the BJT 220(1) is formed from junctions 222(1), 222(2) between the source region 210P and well region 206P, and between the well region 206P and substrate 202, respectively. In this manner, the source region 210P functions as an emitter E1, the well region 206P functions as a base B1, and the substrate 202 functions as a collector C1 of the BJT 220(1). Similarly, the BJT 220(2) is formed from junctions 222(3), 222(4) of the drain region 212P and well region 206P, and between the well region 206P and substrate 202, respectively. In this manner, the drain region 212P functions as an emitter E2, the well region 206P functions as a base B2, and the substrate 202 functions as a collector C2 of the BJT 220(2).

With continuing reference to FIG. 2, the PMOS bi-stable SRAM bit cell 200 also employs a base tap region 224 and a collector tap region 226 (also referred to as base tap region 224P and collector tap region 226P, respectively) so as to provide voltages to the BJTs 220(1), 220(2) for read and write operations. As a non-limiting example, the base tap region 224P in this aspect is formed from an N-type material (N+) such as silicon-carbide (SiC), and the collector tap region 226P is formed from a P+ material such as silicon-germanium (SiGe) or silicon (Si). Further, an STI region 228(1) is formed in the substrate 202 adjacent to a first side 230(1) of the well region 206P and the source region 210P. A bottom surface 232(1) of the STI region 228(1) is lower in a Y-axis direction (Y) in the substrate 202 than a bottom surface 234 of the well region 206P. An STI region 228(2) is formed in the substrate 202 between the base tap region 224P and the collector tap region 226P, and adjacent to a second side 230(2) of the well region 206P and drain region 212P. A bottom surface 232(2) of the STI region 228(2) is lower in the Y-axis direction (Y) in the substrate 202 than the bottom surface 234 of the well region 206P. In this manner, the STI regions 228(1), 228(2) electrically isolate the well region 206P from other elements, such as but not limited to, other well regions in adjacent MOS devices. Further, forming the STI region 228(2) between the base tap region 224P and the collector tap region 226P causes a voltage applied to the collector tap region 226P to be provided to the junctions 222(2), 222(4) between the substrate 202 and the well region 206P (i.e., to the collector C1, C2 of each BJT 220(1), 220(2)).

With continuing reference to FIG. 2, an STI region 228(3) is formed between the drain region 212P and the base tap region 224P. A bottom surface 232(3) of the STI region 228(3) is higher in the Y-axis direction (Y) in the well region 206P than the bottom surface 234 of the well region 206P. Forming the STI region 228(3) in this manner results in a voltage applied to the base tap region 224P being provided directly to the well region 206P, which corresponds to the bases B1, B2 of the BJTs 220(1), 220(2), wherein the bases B1, B2 can also be referred to as the body of the PMOS transistor 218P. Employing the base tap region 224P, collector tap region 226P, and STI regions 228(1)-228(3) as described above avoids the need for an additional layer for a buried well region as in a conventional bi-stable SRAM bit cell, thus reducing manufacturing costs. Further, providing voltages directly to the bases B1, B2 and collectors C1, C2 allows the PMOS bi-stable SRAM bit cell 200 to charge the well region 206P during a write operation without traversing through an additional layer as in a conventional bi-stable SRAM bit cell, thus allowing for faster direct writing. Providing voltage in this manner also allows the charge stored in the well region 206P to be determined during a read operation of the PMOS bi-stable SRAM bit cell 200.

For example, with continuing reference to FIG. 2, to perform read and write operations on the PMOS bi-stable SRAM bit cell 200, the source region 210P is electrically coupled to a source line SL, the drain region 212P is electrically coupled to a bit line BL, and the gate region 214P is electrically coupled to a word line WL. Further, the base tap region 224P is electrically coupled to a base tap line BT and the collector tap region 226P is electrically coupled to a collector tap line CT. To write a data value "0," zero (0) volts (V) are applied to the word line WL and the collector tap line CT, a supply voltage (e.g., Vdd) is applied to the base tap line BT, and a voltage higher than the supply voltage (e.g., Vdd+0.5V) is applied to both the source line SL and the bit line BL. Applying 0V to the word line WL activates the PMOS transistor 218P such that current can flow in the channel 216P, and applying the supply voltage to the base tap line BT maintains a threshold voltage Vt of the PMOS transistor 218P. Additionally, because the voltage on each emitter E1, E2 is higher than the voltage on each base B1, B2, and the voltage on each base B1, B2 is higher than the voltage on each collector C1, C2, the BJTs 220(1), 220(2) are both in an active state. Placing the BJTs 220(1), 220(2) in an active state allows positive carriers (i.e., holes) that are stored in the well region 206P to flow from each base B1, B2 to each collector C1, C2. Further, additional positive carriers (i.e., holes) accumulate in the well region 206P because a drain-to-source voltage $V_{SD}$ is 0V. Thus, the combination of voltages described above writes a data value "0" by moving PNP bipolar positive carriers from the emitters E1, E2 to the bases B1, B2 corresponding to the well region 206P while not adding any additional current (i.e., charge) across the channel 216P. In this manner, the data value "0" is written to the PMOS bi-stable SRAM bit cell 200 directly and without the need for a negative charge pump as in conventional bi-stable SRAM bit cells.

With continuing reference to FIG. 2, to write a data value "1," 0V are applied to the word line WL and the collector tap line CT, a divided supply voltage (e.g., Vdd/2) is applied to the base tap line BT, the supply voltage (e.g., Vdd) is applied to the source line SL, and a voltage less than the supply voltage (e.g., Vdd-0.7V) is applied to the bit line BL. Applying 0V to the word line WL activates the PMOS transistor 218P such that current can flow in the channel 216P, and applying the divided supply voltage to the base tap line BT reduces the threshold voltage Vt of the PMOS transistor 218P. Additionally, because the voltage on emitter E1 is higher than the voltage on the base B1, and the voltage on the base B1 is higher than the voltage on the collector C1, the BJT 220(1) is in an active state. However, assuming that the supply voltage Vdd is a relatively low voltage such as 1.0V, the voltage on the emitter E2 is lower than the voltage on the base B2, which is higher than the voltage on the collector C2 such that the BJT(2) is in a cut-off state. Placing the BJTs 220(1), 220(2) in an active and cut-off state, respectively, results in fewer positive carriers (i.e., holes)

stored in the well region 206P from draining through the collectors C1, C2. Further, because the source-to-drain voltage $V_{SD}$ is positive (e.g., 0.7V), additional positive carriers (i.e., holes) flow in the channel 216P. Thus, the combination of voltages described above writes a data value "1" by "putting" fewer positive carriers in the well region 206P while causing fewer positive carriers from "draining" to the well region 206P. In this manner, the data value "1" is written to the PMOS bi-stable SRAM bit cell 200 directly.

With continuing reference to FIG. 2, to read the value stored in the PMOS bi-stable SRAM bit cell 200, a high impedance Z is applied to the base tap line BT, 0V are applied to the collector tap line CT, the supply voltage (e.g., Vdd) is applied to the source line SL, a reduced voltage (e.g., Vdd-0.2V) is applied to the bit line BL, and the divided source voltage (e.g., Vdd/2) is applied to the gate region 214P. In this manner, the PMOS transistor 218P is partially activated such that reduced current flows across the channel 216P. Additionally, the high impedance Z on the bases B1, B2 results in the bases B1, B2 of both BJTs 220(1), 220(2) being in a cut-off and floating state. Thus, the charge stored in the well region 206P affects the PMOS threshold voltage which affects current flow to the bit line BL, wherein the current on the bit line BL can be sensed to determine the read data value. Additionally, the PMOS bi-stable SRAM bit cell 200 can be set to a stand-by state when no write or read operation is in progress. To operate in the stand-by state, a high impedance Z is applied to the base tap line BT, 0V are applied to the collector tap line CT, and the supply voltage (e.g., Vdd) is applied to the word line WL, the source line SL, and the bit line BL. In this manner, the PMOS transistor 218P is not activated such that no current flows across the channel 216P. Additionally, the high impedance Z on the bases B1, B2 results in both BJTs 220(1), 220(2) being in a cut-off and floating state. Thus, the charge stored in the well region 206P remains unchanged such that the data value of "0" or "1" is maintained.

Figure 3A:
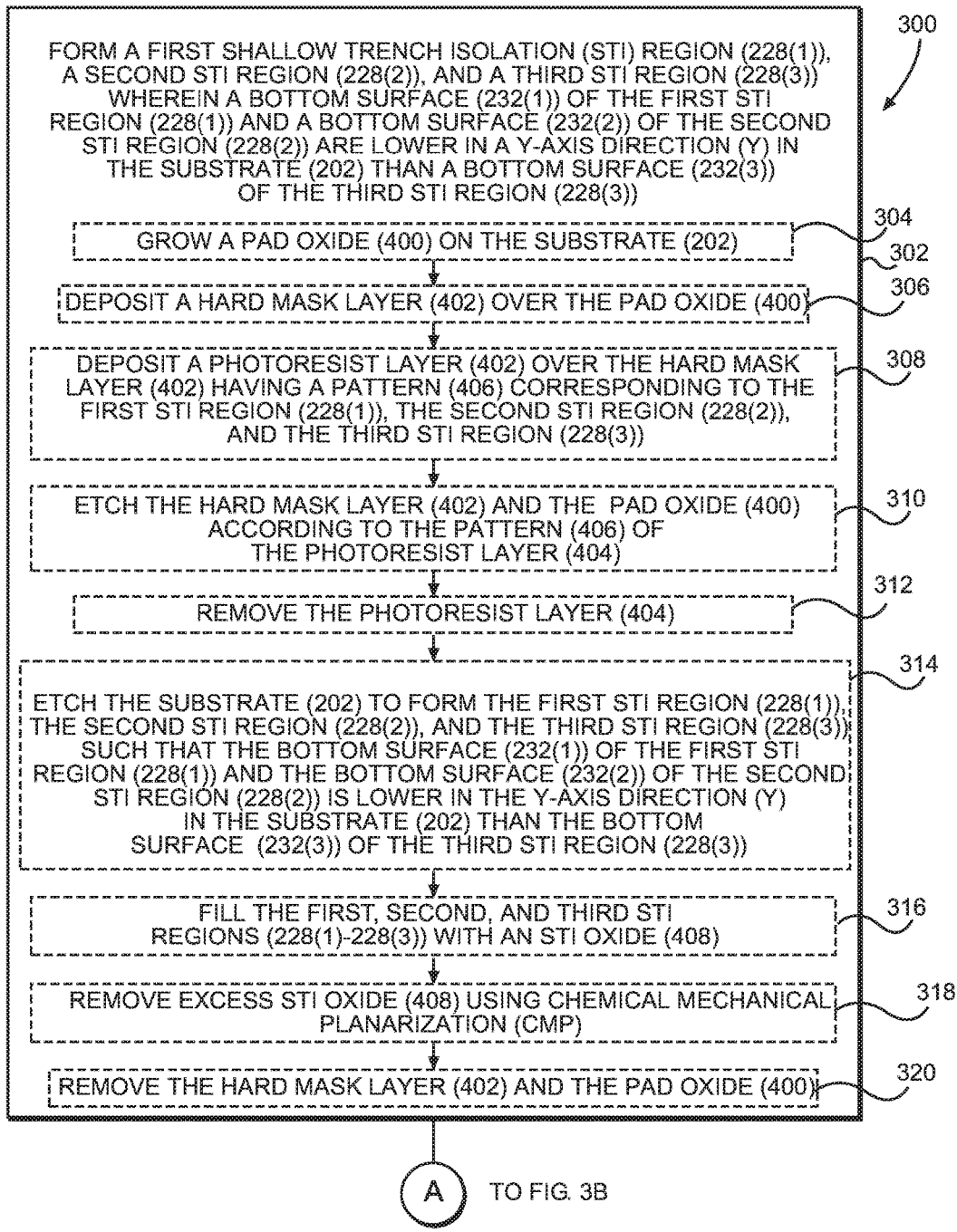
FIGS. 3A-3B provide a flowchart illustrating an exemplary process for fabricating the PMOS bi-stable SRAM bit cell of FIG. 2 that facilitates direct writing for storage.
Figure 3B:
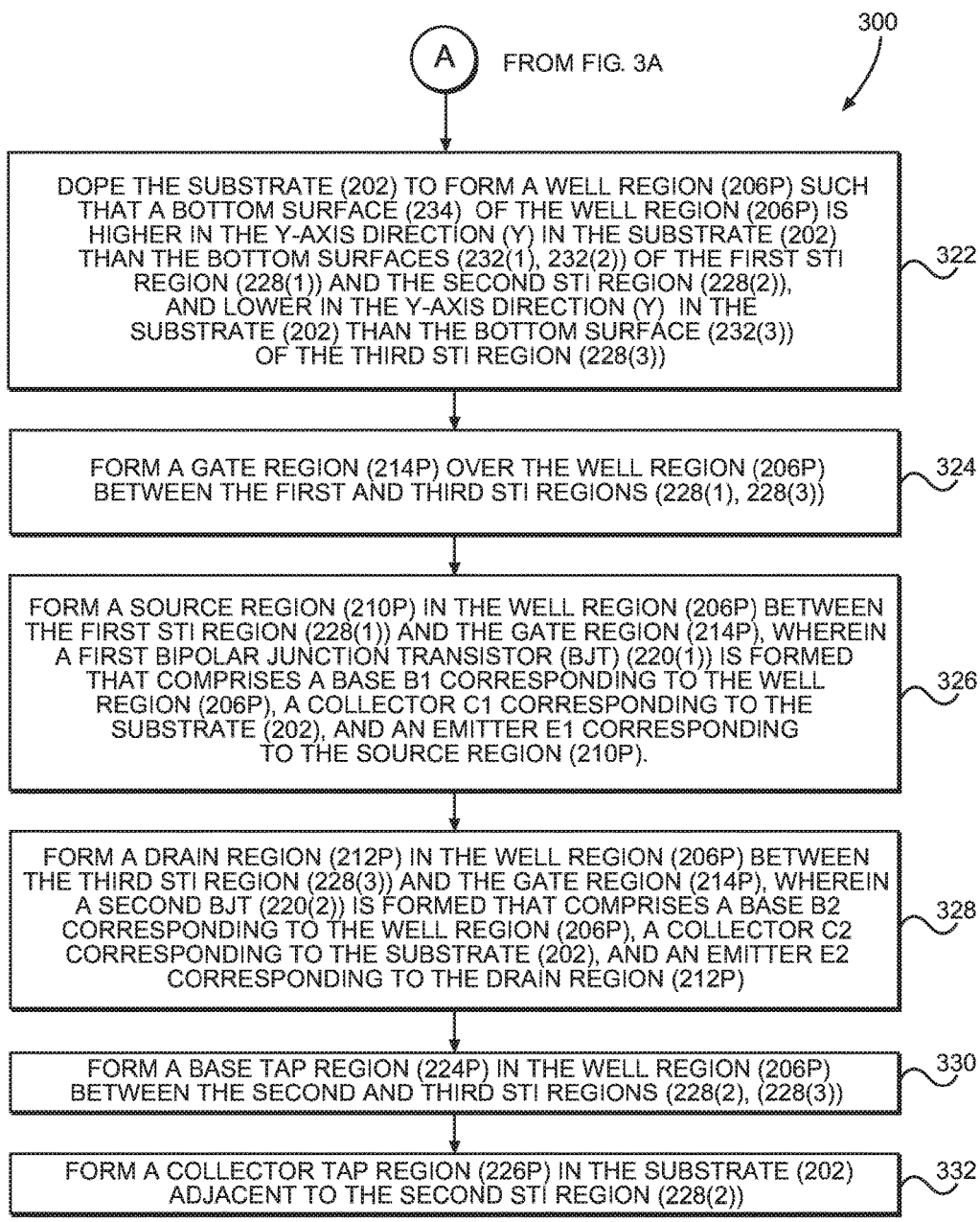

FIGS. 3A-3B illustrate an exemplary fabrication process 300 for the PMOS bi-stable SRAM bit cell 200 of FIG. 2 that facilitates direct writing for storage. FIGS. 4A-4H provide cross-sectional diagrams of the PMOS bi-stable SRAM bit cell 200 of FIG. 2 at each stage of the fabrication process 300 in FIGS. 3A-3B. The cross-sectional diagrams illustrating the PMOS bi-stable SRAM bit cell 200 in FIGS. 4A-4H will be discussed in conjunction with the discussion of the exemplary steps in the fabrication process 300 in FIGS. 3A-3B.

In this regard, the fabrication process 300 in FIGS. 3A-3B includes forming the first STI region 228(1), the second STI region 228(2), and the third STI region 228(3) (block 302, FIGS. 4A-4E). In particular, the bottom surface 232(1) of the first STI region 228(1) and the bottom surface 232(2) of the second STI region 228(2) are lower in the Y-axis direction (Y) in the substrate 202 than the bottom surface 232(3) of the third STI region 228(2). Forming the first, second, and third STI regions 228(1)-228(3) in block 302 can be completed using multiple steps. For example, block 302 can include growing a pad oxide 400 on the substrate 202 (block 304, FIG. 4A). Block 302 can also include depositing a hard mask layer 402 over the pad oxide 400 (block 306, FIG. 4A). Additionally, block 302 can include depositing a photoresist layer 404 over the hard mask layer 402 having a pattern 406 corresponding to the first, second, and third STI regions 228(1)-228(3) (block 308, FIG. 4B). Block 302 can also include etching the hard mask layer 402 and the pad oxide 400 according to the pattern 406 of the photoresist layer 404 (block 310, FIG. 4B). Further, block 302 can include removing the photoresist layer 404 (block 312, FIG. 4C). Block 302 can also include etching the substrate 202 to form the first, second, and third STI regions 228(1)-228(3) such that the bottom surface 232(1) of the first STI region 228(1) and the bottom surface 232(2) of the second STI region 228(2) is lower in the Y-axis direction (Y) in the substrate 202 than the bottom surface 232(3) of the third STI region 228(3) (block 314, FIG. 4C). Additionally, block 302 can include filling the first, second, and third STI regions 228(1)-228(3) with an STI oxide 408 (block 316, FIG. 4D). Block 302 can also include removing excess STI oxide 408 using chemical mechanical planarization (CMP) (block 318 and FIG. 4D). Block 302 can also include removing the hard mask layer 402 and the pad oxide 400 (block 320, FIG. 4E).

Figure 4A:
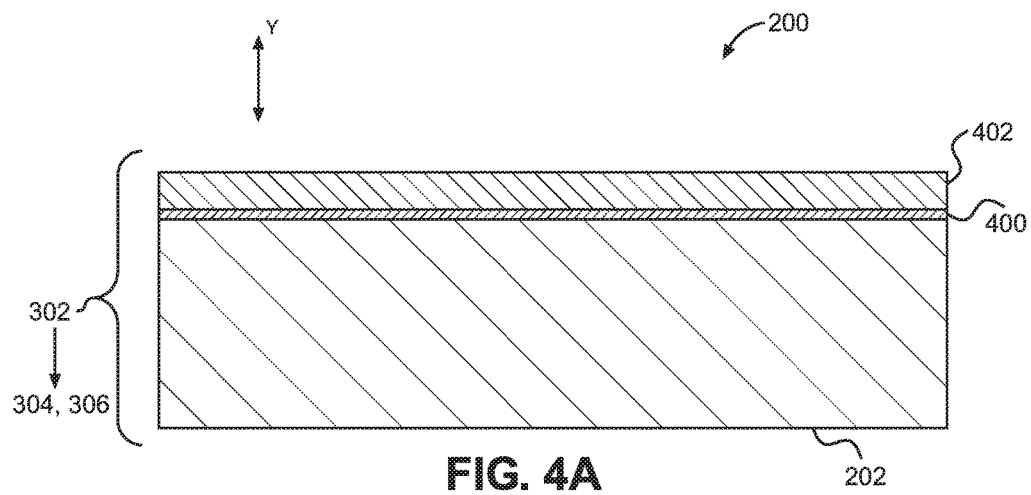
FIGS. 4A-4H are cross-sectional diagrams of the PMOS bi-stable SRAM bit cell of FIG. 2 at each stage of the process of fabrication in FIGS. 3A-3B.
Figure 4B:
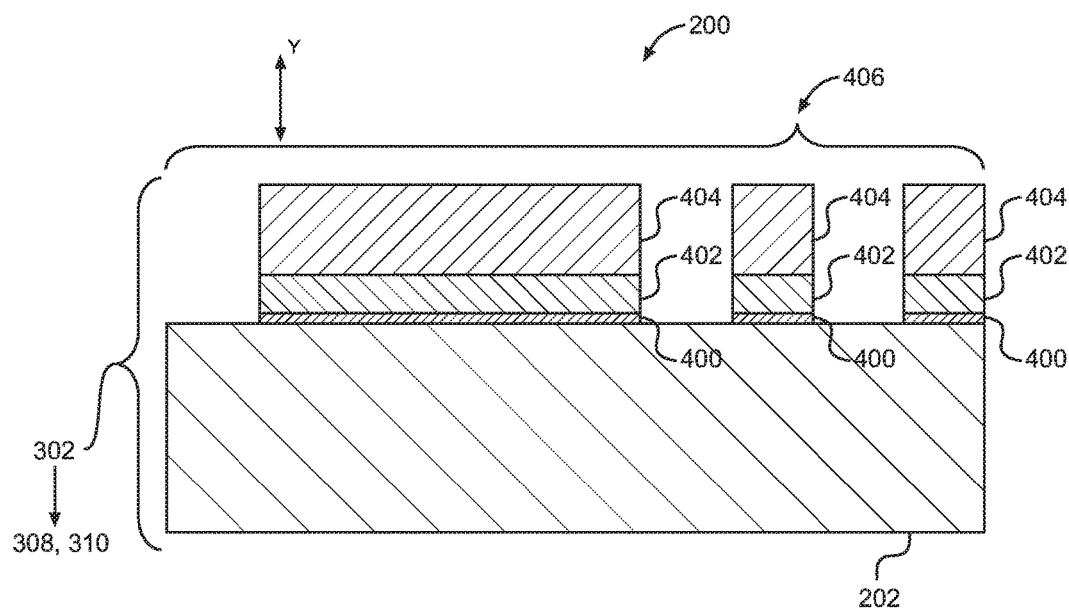
Figure 4C:
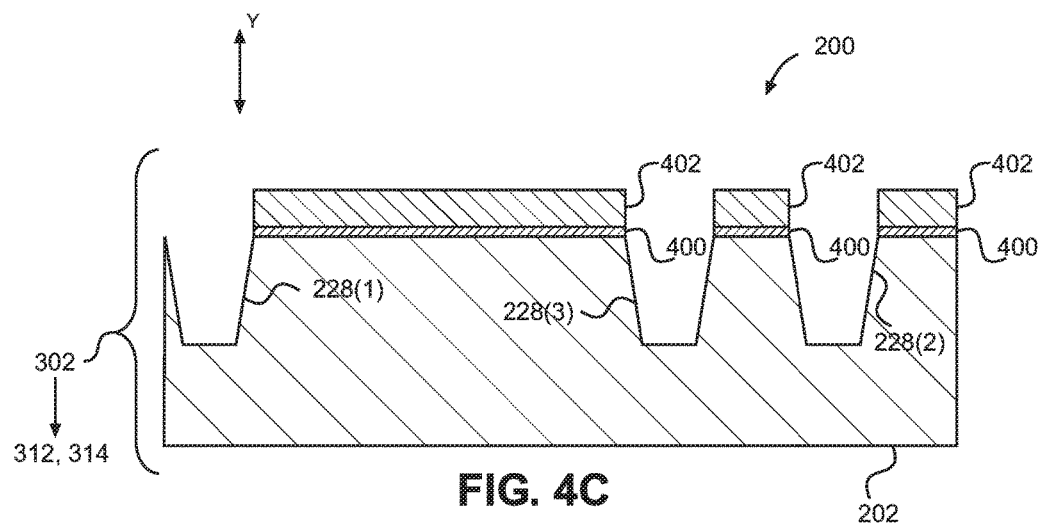
Figure 4D:
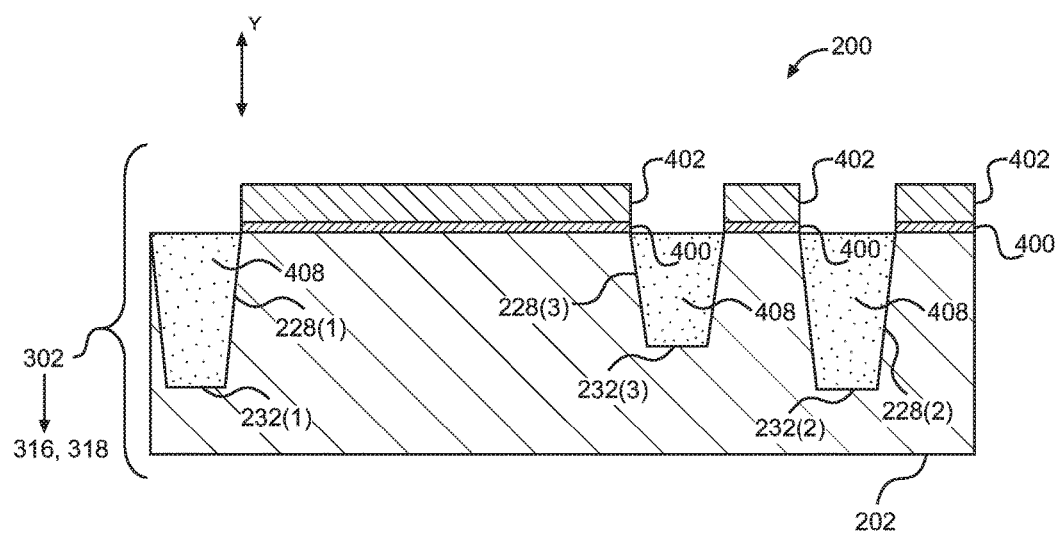
Figure 4E:
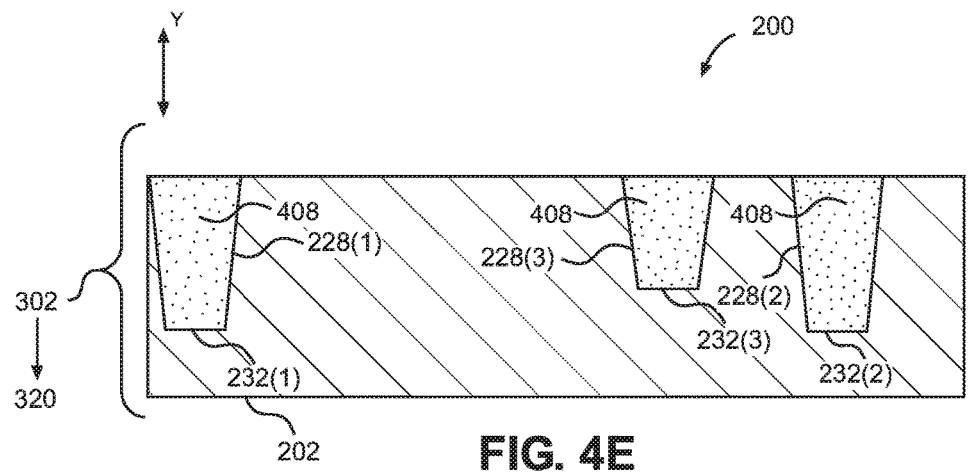
Figure 4F:
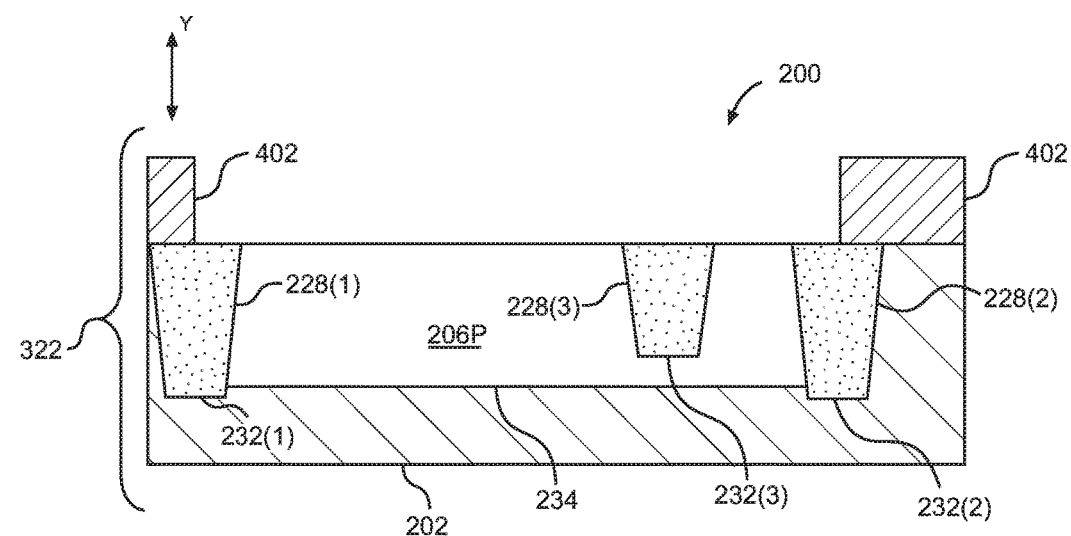
Figure 4G:
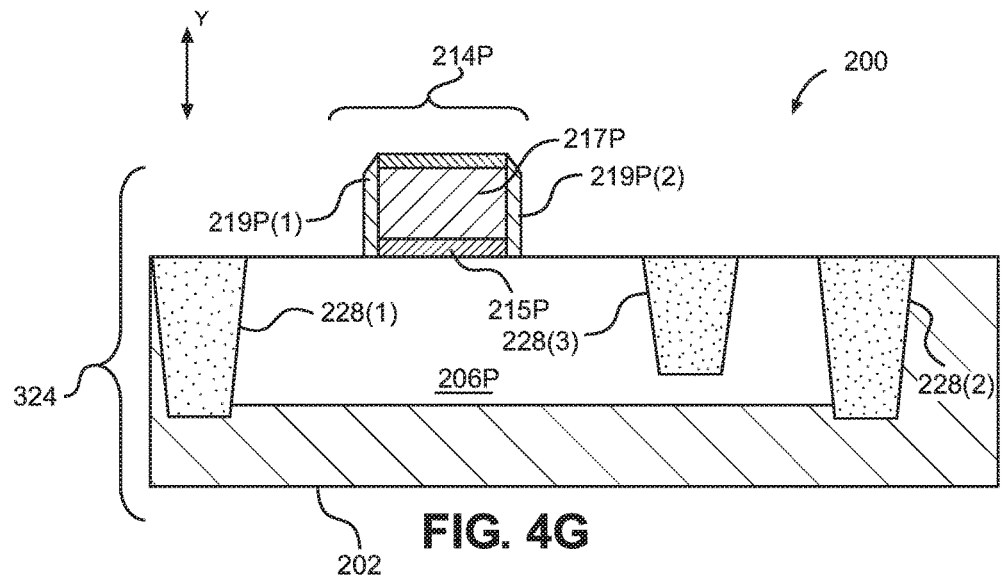
Figure 4H:
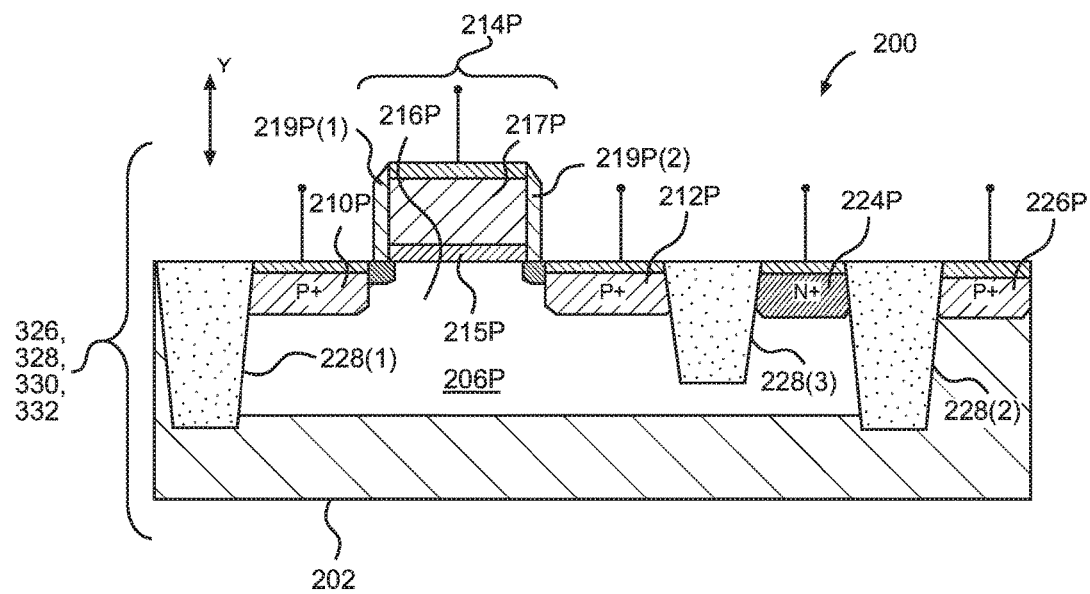

With continuing reference to FIGS. 3A-3B, the process 300 also includes doping the substrate 202 to form the well region 206P (block 322, FIG. 4F). As a non-limiting example, the photoresist layer 404 may be deposited to block portions of the substrate 202 from the doping process. In this manner, the bottom surface 234 of the well region 206P is higher in the Y-axis direction (Y) in the substrate 202 than the bottom surfaces 232(1), 232(2) of the first and second STI regions 228(1), 228(2), and lower in the Y-axis direction (Y) in the substrate 202 than the bottom surface 232(3) of the third STI region 228(3). Additionally, the process 300 includes forming the gate region 214P over the well region 206P between the first STI region 228(1) and the third STI region 228(3) (block 324, FIG. 4G). As a non-limiting example, the gate region 214P may be formed as a high-dielectric metal gate (HKMG) such that it includes the gate oxide layer 215P as a high-k dielectric gate oxide layer 215P disposed over the well region 206P, and the metal gate layer 217P disposed over the high-k dielectric gate oxide layer 215P between the spacers 219P(1), 219P(2). The fabrication process 300 also includes forming the source region 210P adjacent to the well region 206P between the first STI region 228(1) and the gate region 214P, wherein a first BJT 220(1) is formed that comprises a base B1 corresponding to the well region 206P, a collector C1 corresponding to the substrate 202, and an emitter E1 corresponding to the source region 210P (block 326, FIG. 4H). Further, the fabrication process 300 includes forming the drain region 212P adjacent to the well region 206P between the third STI region 228(3) and the gate region 214P, wherein a second BJT 220(2) is formed that comprises a base B2 corresponding to the well region 206P, a collector C2 corresponding to the substrate 202, and an emitter E2 corresponding to the drain region 212P (block 328, FIG. 4H). As a non-limiting example, the source and drain regions 210P, 212P can each be formed by doping the corresponding portions of the well region 206P with a corresponding material using existing implantation techniques. The fabrication process 300 also includes forming the base tap region 224P adjacent to the well region 206P between the second STI region 228(2) and the third STI region 228(3) (block 330, FIG. 4H). Additionally, the fabrication process 300 includes forming the collector tap region 226P in the substrate 202 adjacent to the second STI region 228(2) (block 332, FIG. 4H). As a non-limiting example, the base tap and collector tap regions 224P, 226P can each be formed by doping the corresponding portions of the substrate 202 with a corresponding material using existing implantation techniques.

Figure 5A:
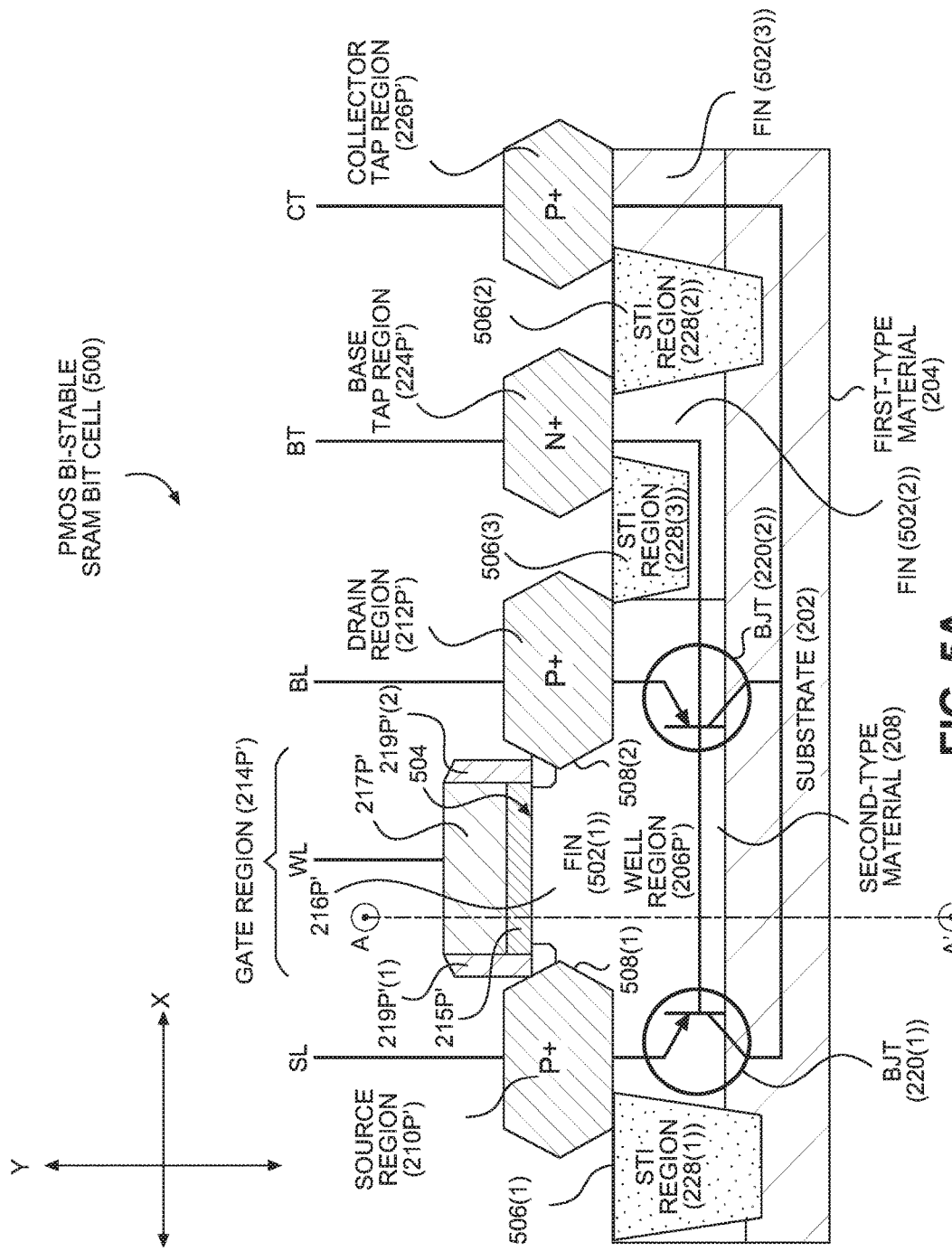
FIG. 5A is a cross-sectional diagram of an exemplary PMOS bi-stable SRAM bit cell that facilitates direct writing for storage in Fin Field-Effect Transistor (FET) (FinFET) technology.
Figure 5B:
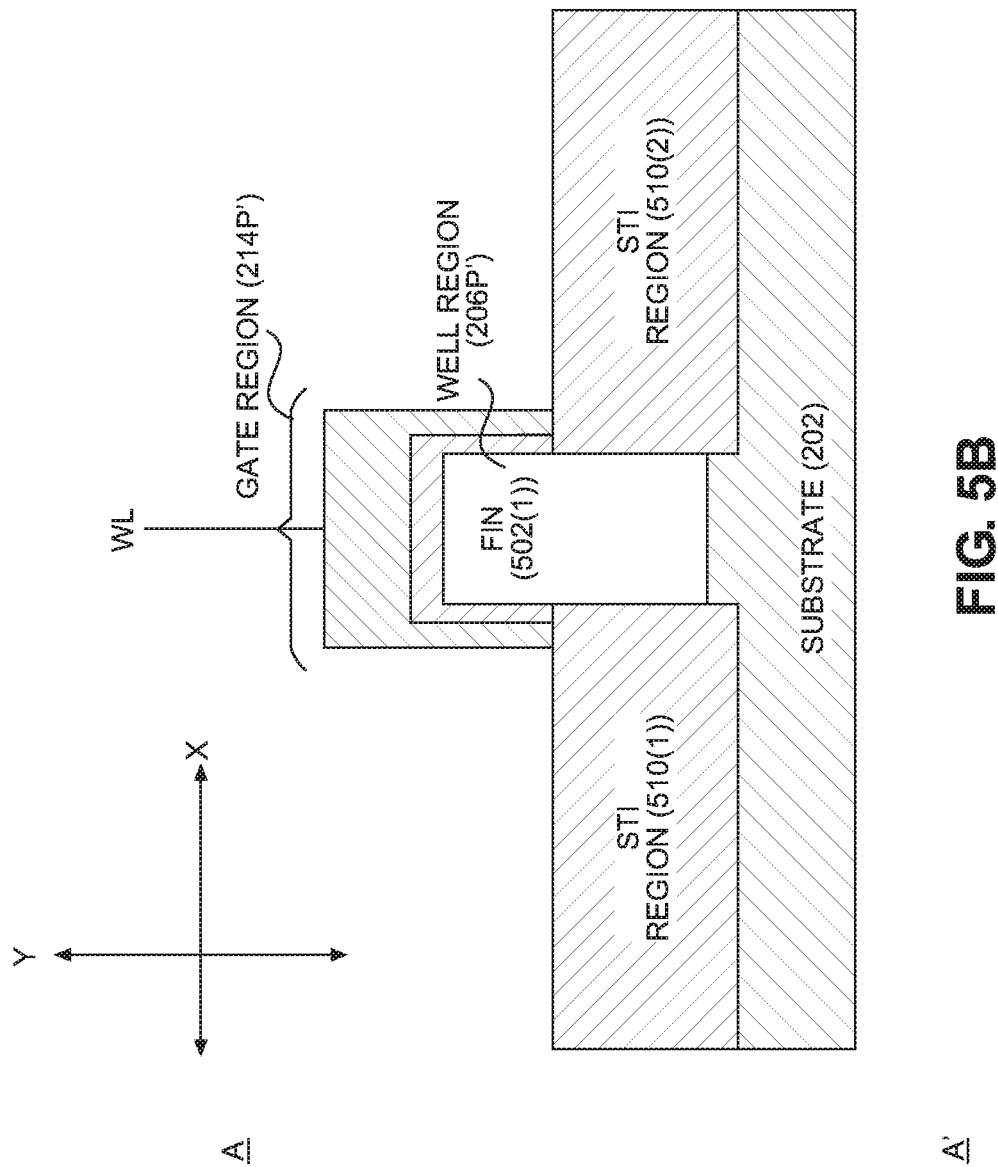
FIG. 5B is a cross-sectional diagram of the PMOS bi-stable SRAM bit cell in FIG. 5A along a line A-A' and rotated 90 degrees.

Although the PMOS bi-stable SRAM bit cell 200 of FIG. 2 is employed using planar transistor technology, other aspects may include alternative technology, such as but not limited to Fin Field-Effect Transistor (FET) (FinFET) technology. In this regard, FIGS. 5A and 5B illustrate an exemplary PMOS bi-stable SRAM bit cell 500 that facilitates direct writing for storage in FinFET technology. FIG. 5A provides a cross-sectional diagram of the PMOS bi-stable SRAM bit cell 500 along one direction of Fins 502(1)-502(3), and FIG. 5B provides a cross-sectional diagram of the PMOS bi-stable SRAM bit cell 500 along a line A-A' and rotated 90 degrees compared to FIG. 5A. The PMOS bi-stable SRAM bit cell 500 includes common elements with the PMOS bi-stable SRAM bit cell 200 of FIG. 2, which are referred to with common element numbers in FIG. 2 and FIGS. 5A, 5B, and thus will not re-described herein.

With continuing reference to FIGS. 5A and 5B, the PMOS bi-stable SRAM bit cell 500 employs the Fin 502(1) having a top surface 504 that extends above a top surface 506(1)-506(3) of each STI region 228(1)-228(3). In this aspect, a well region 206P' is formed by doping the Fin 502(1) with the second-type material 208, while the substrate 202 is formed from the first-type material 204. The PMOS bi-stable SRAM bit cell 500 also includes a source region 210P' formed on a first side 508(1) of the Fin 502(1), and a drain region 212P' formed on a second side 508(2) of the Fin 502(1), such that the source and drain regions 210P', 212P' are both formed above the top surfaces 506(1)-506(3). Additionally, the PMOS bi-stable SRAM bit cell 500 includes a gate region 214P' formed over the Fin 502(1) and between the source and drain regions 210P', 212P' such that the gate region 214P' is formed over a channel 216P'. The gate region 214P' includes a gate oxide later 215P', a metal gate 217P', and spacers 219P'(1), 219P'(2). The PMOS bi-stable SRAM bit cell 500 also includes a base tap region 224P' and a collector tap region 226P' formed above the top surfaces 506(1)-506(3). In particular, the base tap region 224P' is formed over the Fin 502(2) between the STI regions 228(2), 228(3), and the collector tap region 226P' is formed over the Fin 502(3) such that the STI region 228(2) is positioned between the base tap and collector tap regions 224P', 226P'. As a non-limiting example, the source region 210P', the drain region 212P', the base tap region 224P', and the collector tap region 226P' may each be formed using an epitaxial growth process. Further, with specific reference to FIG. 5B, the PMOS bi-stable SRAM bit cell 500 also employs STI regions 510(1), 510(2) that electrically isolate the Fin 502(1) from adjacent devices.

Figure 6:
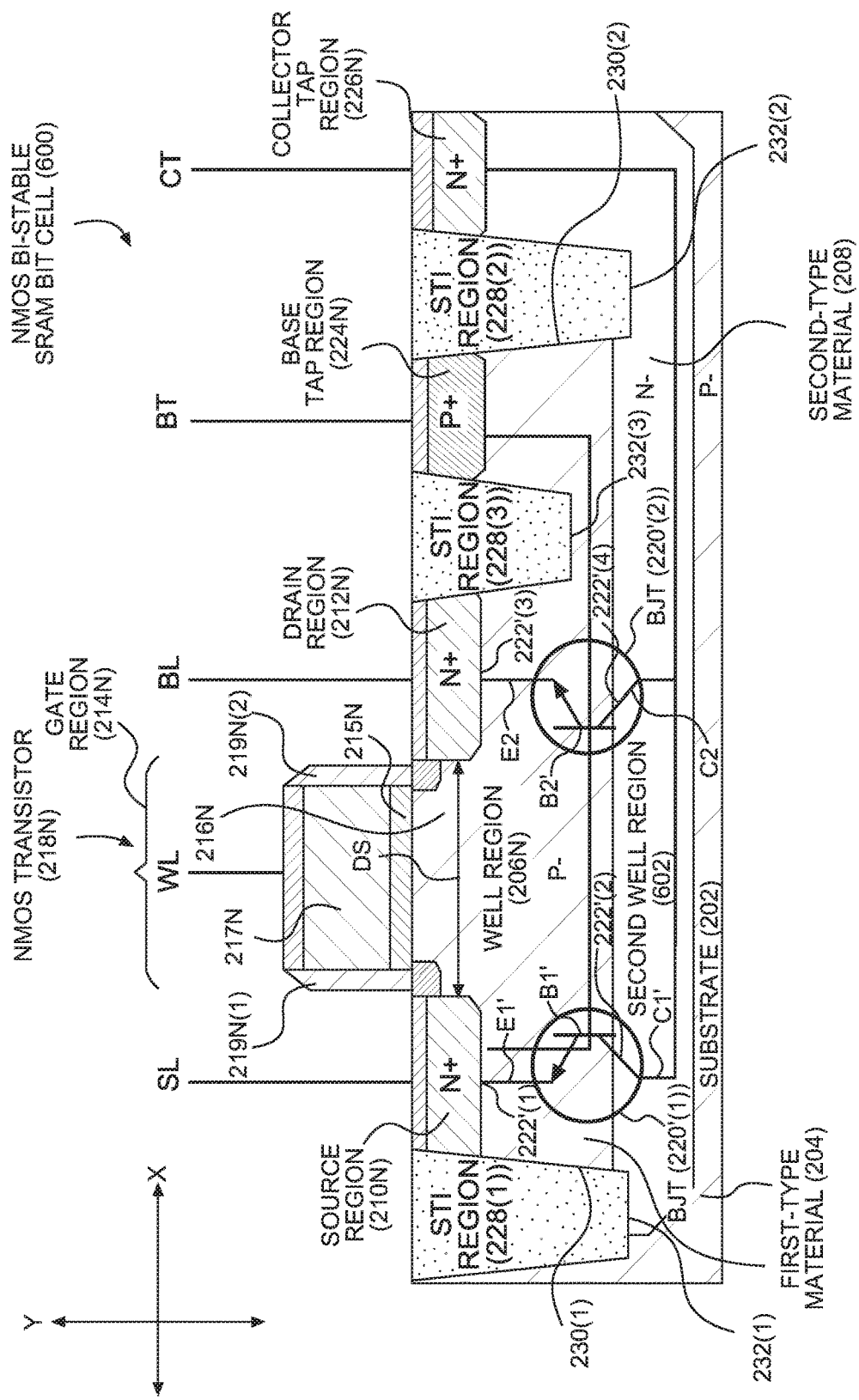
FIG. 6 is a cross-sectional diagram of an exemplary NMOS bi-stable SRAM bit cell that facilitates direct writing for storage.

In addition to the PMOS bi-stable SRAM bit cells 200, 500 of FIGS. 2, 5A, and 5B respectively, aspects disclosed herein also include NMOS bi-stable SRAM bit cells. In this regard, FIG. 6 is a cross-sectional diagram of an exemplary NMOS bi-stable SRAM bit cell 600 that facilitates direct writing for storage. The NMOS bi-stable SRAM bit cell 600 includes common elements with the PMOS bi-stable SRAM bit cell 200 of FIG. 2, which are referred to with common element numbers in FIG. 2 and FIG. 6, and thus will not re-described herein.

With continuing reference to FIG. 6, the NMOS bi-stable SRAM bit cell 600 includes the substrate 202 and a well region 206 (also referred to as well region 206N) formed from a first-type material 204. Additionally, the NMOS bi-state SRAM bit cell 600 includes a second well region 602 formed by doping the substrate 202 adjacent to the well region 206N with a second-type material 208. As a non-limiting example, the first-type material 204 in this aspect is a P-type material (P−) 204, and the second-type material 208 is an N-type material (N−) 208. As used herein, (P−) and (N−) means that the first- and second-type materials 204, 208 have less P-type material dopant and N-type material dopant, respectively, than materials categorized as (P+) and (N+). The NMOS bi-stable SRAM bit cell 600 also includes a source region 210 and a drain region 212 (also referred to as source region 210N and drain region 212N, respectively) formed adjacent to the well region 206N (e.g., buried in the well region 206N) and over a channel 216N, wherein the drain region 212N is formed a distance DS (e.g., a gate width) in the X-axis direction (X) from the source region 210N. In this aspect, the source and drain regions 210N, 212N are both formed from an N-type material (N+) such as silicon-carbide (SiC) or silicon (Si). Additionally, a gate region 214 (also referred to as gate region 214N) is formed over the well region 206N between the source and drain regions 210N, 212N, wherein the gate region 214N includes a gate oxide later 215N, a metal gate 217N, and spacers 219N(1), 219N(2). In other words, the NMOS bi-stable SRAM bit cell 600 in this aspect is formed using one (1) NMOS transistor 218N. Two (2) bipolar junction transistors (BJTs) 220'(1), 220'(2) are formed within the NMOS bi-stable SRAM bit cell 600 (e.g., NPN BJTs 220'(1), 220'(2)). In particular, the BJT 220'(1) is formed from junctions 222'(1), 222'(2) between the source region 210N and well region 206N, and between the well region 206N and second well region 602, respectively. In this manner, the source region 210N functions as an emitter E1', the well region 206N functions as a base B1', and the second well region 602 functions as a collector C1' of the BJT 220'(1). Similarly, the BJT 220'(2) is formed from junctions 222'(3), 222'(4) of the drain region 212N and well region 206N, and between the well region 206N and second well region 602. In this manner, the drain region 212N functions as an emitter E2', the well region 206N functions as a base B2', and the second well region 602 functions as a collector C2' of the BJT 220'(2).

With continuing reference to FIG. 6, the NMOS bi-stable SRAM bit cell 600 also employs a base tap region 224 and a collector tap region 226 (also referred to as base tap region 224N and collector tap region 226N). As a non-limiting example, the base tap region 224N in this aspect is formed from a P-type material (P+), and the collector tap region 226N is formed from an N+ material. Further, the NMOS bi-stable SRAM bit cell 600 includes STI regions 228(1)-228(3) as described with reference to the PMOS bi-stable SRAM bit cell 200 in FIG. 2. In this manner, similar to the PMOS bi-stable SRAM bit cell 200 in FIG. 2, forming the base tap region 224N, the collector tap region 226N, and STI regions 228(1)-228(3) allows voltages applied to the base tap region 224N and the collector tap region 226N to be directly applied to the bases B1', B2' and collectors C1', C2', respectively. Providing voltages in this manner allows the NMOS bi-stable SRAM bit cell 600 to charge the well region 206N during a write operation without traversing through an additional layer such as in a conventional bi-stable SRAM bit cell, thus allowing for faster direct writing. Further, providing voltage directly to the bases B1', B2' and collectors C1', C2' also allows the charge stored in the well region 206N to be determined during a read operation of the NMOS bi-stable SRAM bit cell 600.

Figure 7:
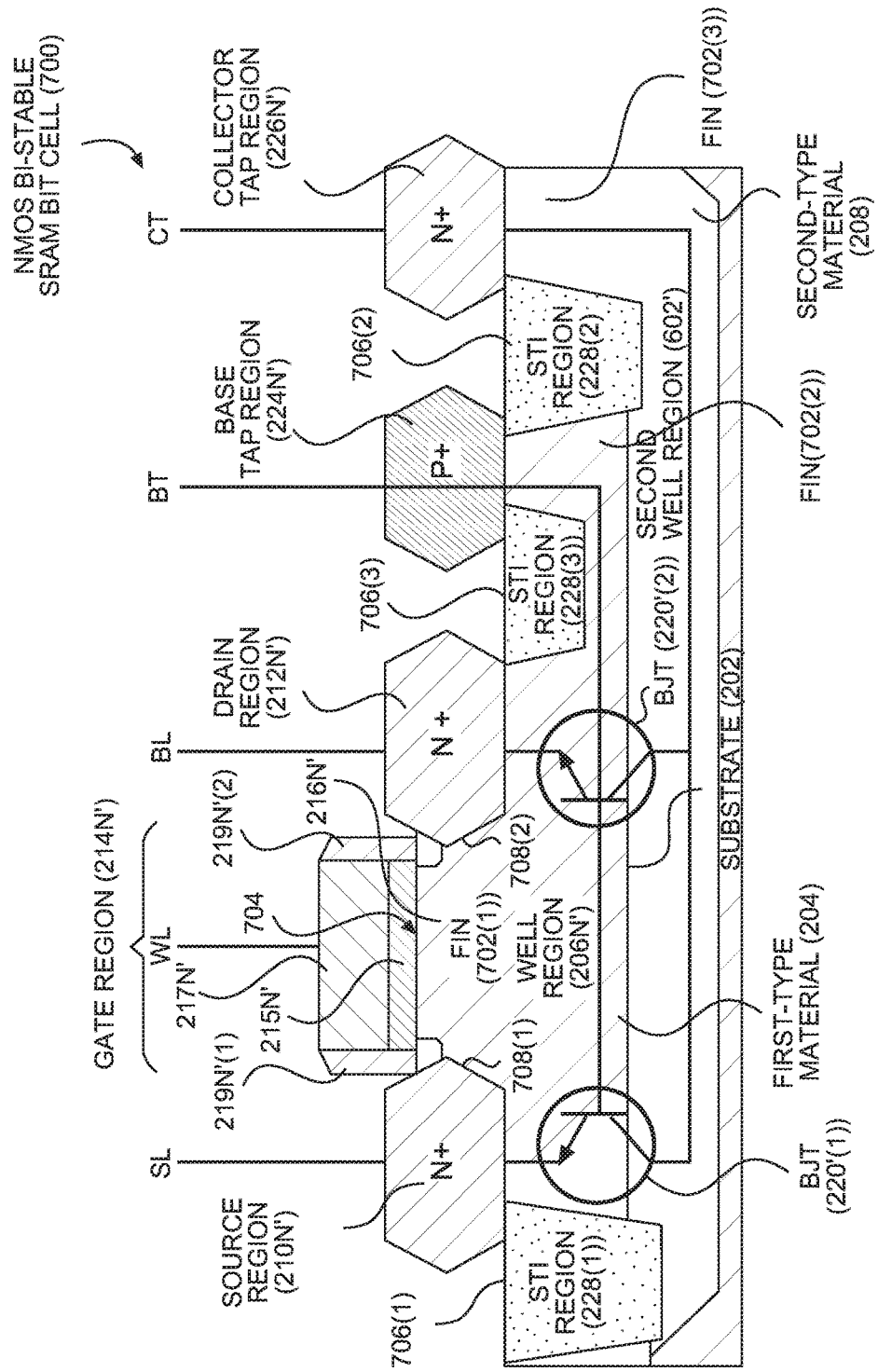
FIG. 7 is a cross-sectional diagram of an exemplary NMOS bi-stable SRAM bit cell that facilitates direct writing for storage in FinFET technology.

Although the NMOS bi-stable SRAM bit cell 600 of FIG. 6 is employed using planar transistor technology, other aspects may include alternative technology. In this regard, FIG. 7 illustrates an exemplary NMOS bi-stable SRAM bit cell 700 that facilitates direct writing for storage in FinFET technology. The NMOS bi-stable SRAM bit cell 700 includes common elements with the NMOS bi-stable SRAM bit cell 600 of FIG. 6, which are referred to with common element numbers in FIG. 6 and FIG. 7, and thus will not re-described herein.

With continuing reference to FIG. 7, the NMOS bi-stable SRAM bit cell 700 employs a Fin 702(1) having a top surface 704 that extends above a top surface 706(1)-706(3) of each STI region 228(1)-228(3). In this this aspect, a well region 206N' is formed in the Fin 702(1) using a first-type material 204, wherein the substrate 202 is also formed from the first-type material 204. The NMOS bi-stable SRAM bit cell 700 also includes a second well region 602' formed from a second-type material 208. The NMOS bi-stable SRAM bit cell 700 also includes a source region 210N' formed on a first side 708(1) of the Fin 702(1), and a drain region 212N' formed on a second side 708(2) of the Fin 702(1) such that the source and drain regions 210N', 212N' are both formed above the top surfaces 706(1)-706(3). Additionally, the NMOS bi-stable SRAM bit cell 700 includes a gate region 214N' formed over the Fin 702(1) and between the source and drain regions 210N', 212N' such that the gate region 214N' is formed over a channel 216N'. The gate region 214N' includes a gate oxide layer 215N', a metal gate 217N', and spacers 219N'(1), 219N'(2). The NMOS bi-stable SRAM bit cell 700 also includes a base tap region 224N' and a collector tap region 226N' formed above the top surfaces 706(1)-706(3). In particular, the base tap region 224N' is formed over a Fin 702(2) between the STI regions 228(2), 228(3), and the collector tap region 226N' is formed over a Fin 702(3) such that the STI region 228(2) is positioned between the base tap and collector tap regions 224N', 226N'. As a non-limiting example, the source region 210N', the drain region 212N', the base tap region 224N', and the collector tap region 226N' may each be formed using an epitaxial growth process.

Figure 8:
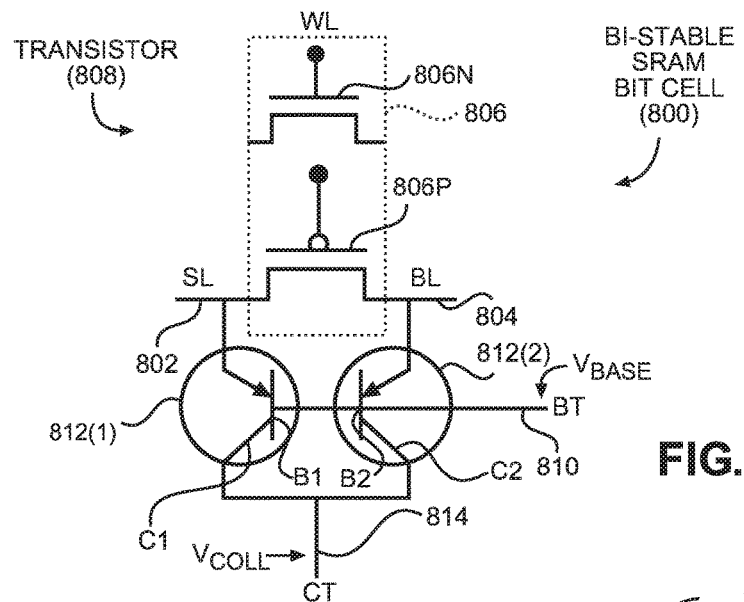
FIG. 8 is a circuit diagram of an exemplary bi-stable SRAM bit cell that facilitates direct writing for storage.

FIG. 8 is a circuit diagram of an exemplary bi-stable SRAM bit cell 800 that facilitates direct writing for storage. The bi-stable SRAM bit cell 800 includes a source electrode 802 electrically coupled to a source line SL, a drain electrode 804 electrically coupled to a bit line BL, and a gate electrode 806 electrically coupled to a word line WL. In other words, the bi-stable SRAM bit cell 800 is formed using a single transistor 808. In particular, the gate electrode 806 may be illustrated as a P-type gate 806P so as to represent a PMOS transistor 808 similar to the PMOS bi-stable SRAM bit cells 200, 500 in FIGS. 2, 5A, and 5B. Alternatively, the gate electrode 806 may be illustrated as an N-type gate 806N so as to represent an NMOS transistor 808, such as the NMOS bi-stable SRAM bit cells 600, 700 in FIGS. 6 and 7. Additionally, the bi-stable SRAM bit cell 800 includes a base tap electrode 810 that may be configured to receive a base voltage $V_{BASE}$ of a base tap line BT that is used to bias bases B1, B2 of corresponding BJTs 812(1), 812(2). The bi-stable SRAM bit cell 800 also includes a collector tap electrode 814 configured to receive a collector voltage $V_{COLL}$ of a collector tap line CT that is used to bias collectors C1, C2 of corresponding BJTs 812(1), 812(2).

Figure 9:
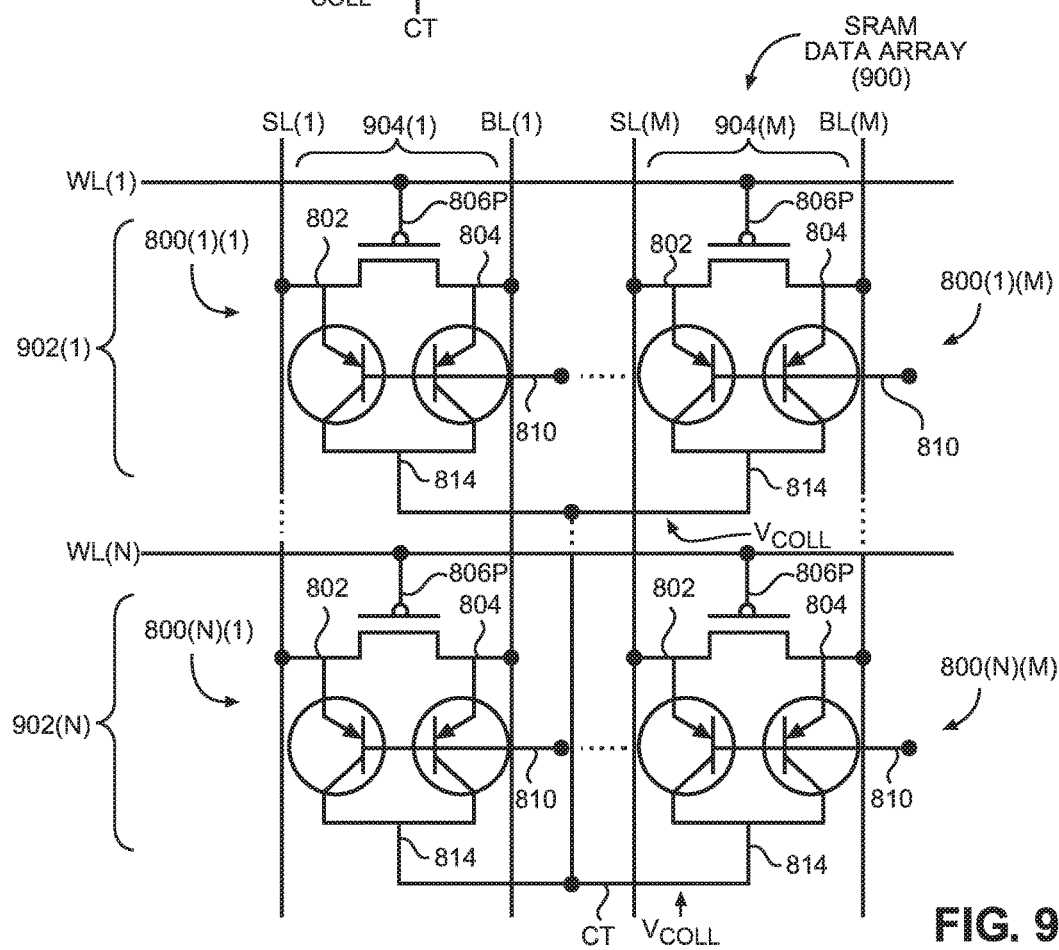
FIG. 9 is a circuit diagram of an exemplary SRAM data array employing the bi-stable SRAM bit cell of FIG. 8 that facilitates direct writing for storage.

FIG. 9 is a circuit diagram of an exemplary SRAM data array 900 employing the bi-stable SRAM bit cell 800 of FIG. 8 that facilitates direct writing for storage. Although the SRAM data array 900 is illustrated with bi-stable SRAM bit cells 800(1)(1)-800(N)(M) having the P-type gate electrode 806P (i.e., PMOS bi-stable SRAM bit cells 800(1)(1)-800(N)(M)), other aspects can include the bi-stable SRAM bit cells 800(1)(1)-800(N)(M) having the N-type gate electrode 806N of FIG. 8 (i.e., NMOS bi-stable SRAM bit cells 800(1)(1)-800(N)(M)). The SRAM data array 900 includes the bi-stable SRAM bit cells 800(1)(1)-800(N)(M) organized into SRAM bit cell rows 902(1)-902(N) and SRAM bit cell columns 904(1)-904(M). In this manner, each bi-stable SRAM bit cell 800(1)(1)-800(N)(M) corresponds to a particular SRAM bit cell row 902(1)-902(N) and SRAM bit cell column 904(1)-904(M). Further, the SRAM data array 900 employs a word line WL(1)-WL(N) electrically coupled to the P-type gate electrode 806P of each bi-stable SRAM bit cell 800(1)(1)-800(N)(M) on each corresponding SRAM bit cell row 902(1)-902(N). In this manner, the word lines WL(1)-WL(N) can be used to access the selected bi-stable SRAM bit cells 800(1)(1)-800(N)(M) for read and write operations. The SRAM data array 900 also employs source lines SL(1)-SL(M) electrically coupled to the source electrode 802 of each corresponding bi-stable SRAM bit cell 800(1)(1)-800(N)(M), and bit lines BL(1)-BL(M) electrically coupled to the drain electrode 804 of each corresponding bi-stable SRAM bit cell 800(1)(1)-800(N)(M). In this manner, the source lines SL(1)-SL(M) and bit lines BL(1)-BL(M) are used to drive voltages to the bi-stable SRAM bit cells 800(1)(1)-800(N)(M) of each corresponding SRAM bit cell column 904(1)-904(M). The base tap electrode 810 on each corresponding bi-stable SRAM bit cell 800(1)(1)-800(N)(M) is left in a floating state. Additionally, each collector tap electrode 814 is configured to receive the collector voltage $V_{COLL}$ from a corresponding collector tap line CT.

In this regard, FIG. 10 is a table 1000 illustrating exemplary voltages to apply to the SRAM data array 900 of FIG. 9 when employing PMOS bi-stable SRAM bit cells 800(1)(1)-800(N)(M) that facilitate direct writing for storage. The table 1000 is divided into columns 1002(1)-1002(5) and rows 1004(1)-1004(8). In particular, the row 1004(1) includes operation names (i.e., a write operation of data value "0" (W0), a write operation of data value "1" (W1), a read operation (Read), and a stand-by state (Stand-by)). Additionally, column 1002(1) includes a name of each element in the SRAM data array 900 of FIG. 9 in each corresponding row 1004(2)-1004(8). For example, column 1002(1) includes entries for a WL, BL, and SL of a selected PMOS bi-stable SRAM bit cell 800(1)(1)-800(N)(M) on which an operation is to be performed (i.e., Select WL, Select BL, and Select SL). Column 1002(1) also includes entries for a WL, BL, and SL of a selected PMOS bi-stable SRAM bit cell 800(1)(1)-800(N)(M) on which an operation is not to be performed (i.e., Unselect WL, Unselect BL, and Unselect SL). Finally, column 1002(1) includes an entry for a collector tap signal CT. Further, columns 1002(2)-1002(5) include exemplary voltages that may be provided to the element of the corresponding row 1004(2)-1004(8) to achieve the corresponding operation. For example, columns 1002(2)-1002(5) includes voltages to perform a write operation of data value "0" (W0), a write operation of data value "1" (W1), a read operation (Read), or a stand-by state (Stand-by).

Figure 11:
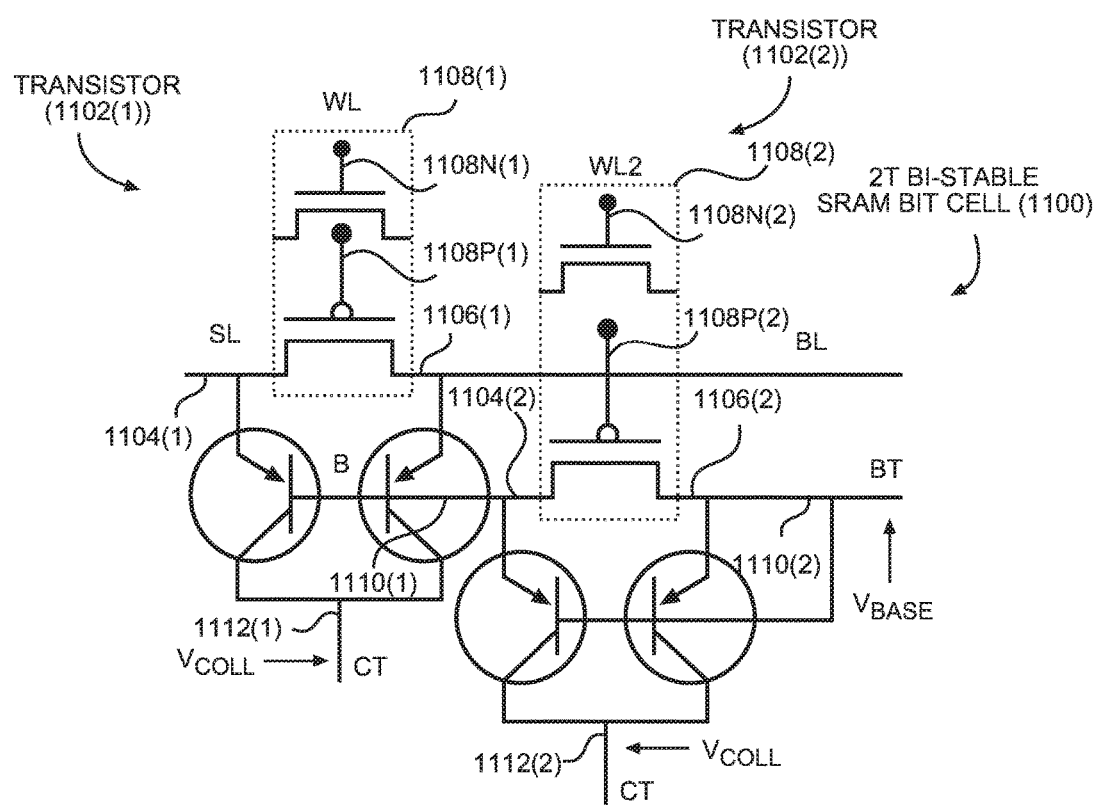
FIG. 11 is a circuit diagram of an exemplary two transistor (2T) bi-stable SRAM bit cell that facilitates direct writing for storage.

In addition to the bi-stable SRAM bit cell 800 in FIG. 8 that employs a single transistor 808, other aspects may include additional transistors to reduce leakage. In this regard, FIG. 11 is a circuit diagram of an exemplary two transistor (2T) bi-stable SRAM bit cell 1100 that facilitates direct writing for storage. In particular, the 2T bi-stable SRAM bit cell 1100 includes transistors 1102(1), 1102(2). The transistor 1102(1) includes a source electrode 1104(1), a drain electrode 1106(1), and a gate electrode 1108(1), wherein the gate electrode 1108(1) is electrically coupled to a word line WL. The gate electrode 1108(1) may be illustrated as a P-type gate 1108P(1) so as to represent a PMOS transistor 1102(1), or an N-type gate 1108N(1) so as to represent an NMOS transistor 1102(1). Further, the transistor 1102(1) includes a base tap electrode 1110(1) configured to receive a base tap voltage $V_{BASE}$, and a collector tap electrode 1112(1) configured to receive a collector tap voltage $V_{COLL}$. The transistor 1102(2) includes a source electrode 1104(2) electrically coupled to the base tap electrode 1110(1), a drain electrode 1106(2) configured to receive a direct write voltage (e.g., the base tap voltage $V_{BASE}$), and a gate electrode 1108(2) electrically coupled to a second word line WL2. The gate electrode 1108(2) may be illustrated as a P-type gate 1108P(2) so as to represent a PMOS transistor 1102(2), or an N-type gate 1108N(2) so as to represent an NMOS transistor 1102(2). Additionally, the transistor 1102(2) includes a base tap electrode 1110(2) configured to receive the base tap voltage $V_{BASE}$, and a collector tap electrode 1112(2) configured to receive a collector tap voltage $V_{COLL}$. Configuring the 2T bi-stable SRAM bit cell 1100 in this manner allows the 2T bi-stable SRAM bit cell 1100 to achieve direct bit-to-bit writing, as opposed to memory-block level writing, without causing read or write disturbances in other SRAM cells.

Figure 12:
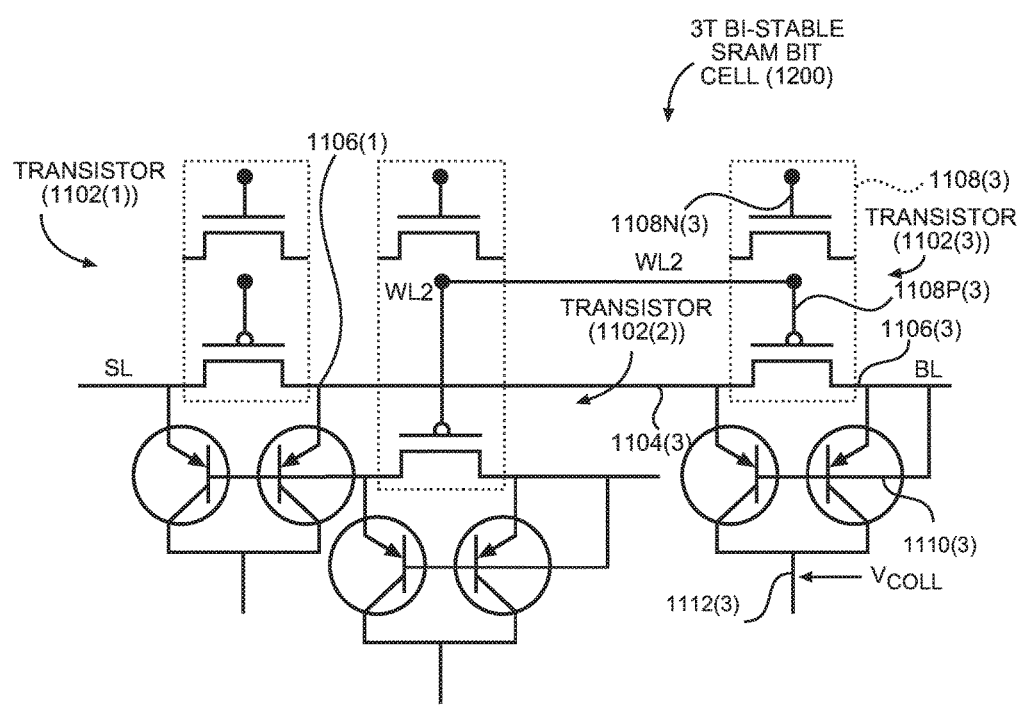
FIG. 12 is a circuit diagram of an exemplary three transistor (3T) bi-stable SRAM bit cell that facilitates direct writing for storage.

FIG. 12 is a circuit diagram of an exemplary three transistor (3T) bi-stable SRAM bit cell 1200 that facilitates direct writing for storage. The 3T bi-stable SRAM bit cell 1200 includes common elements with the 2T bi-stable SRAM bit cell 1100 of FIG. 11, which are referred to with common element numbers in FIG. 11 and FIG. 12, and thus will not re-described herein. With continuing reference to FIG. 12, in addition to the transistors 1102(1), 1102(2) as described with reference to FIG. 11, the 3T bi-stable SRAM bit cell 1200 includes a transistor 1102(3). In particular, transistor 1102(3) includes a source electrode 1104(3) electrically coupled to the drain electrode 1106(1), a drain electrode 1106(3) electrically coupled to a bit line BL, and a gate electrode 1108(3) electrically coupled to the second word line WL2. The gate electrode 1108(3) may be illustrated as a P-type gate 1108P(3) so as to represent a PMOS transistor 1102P(3), or an N-type gate 1108N(3) so as to represent an NMOS transistor 1102N(3). Further, the transistor 1102(3) includes a base tap electrode 1110(3) electrically coupled to the bit line BL, and a collector tap electrode 1112(3) configured to receive a collector tap voltage $V_{COLL}$. Configuring the 3T bi-stable SRAM bit cell 1200 in this manner results in the transistor 1102(3) isolating the bit line BL from the transistors 1102(1), 1102(2) such that leakage of the transistors 1102(1), 1102(2) corresponding to the bit line BL is reduced.

The bi-stable SRAM bit cells that facilitate direct writing for storage according to aspects disclosed herein may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 13:
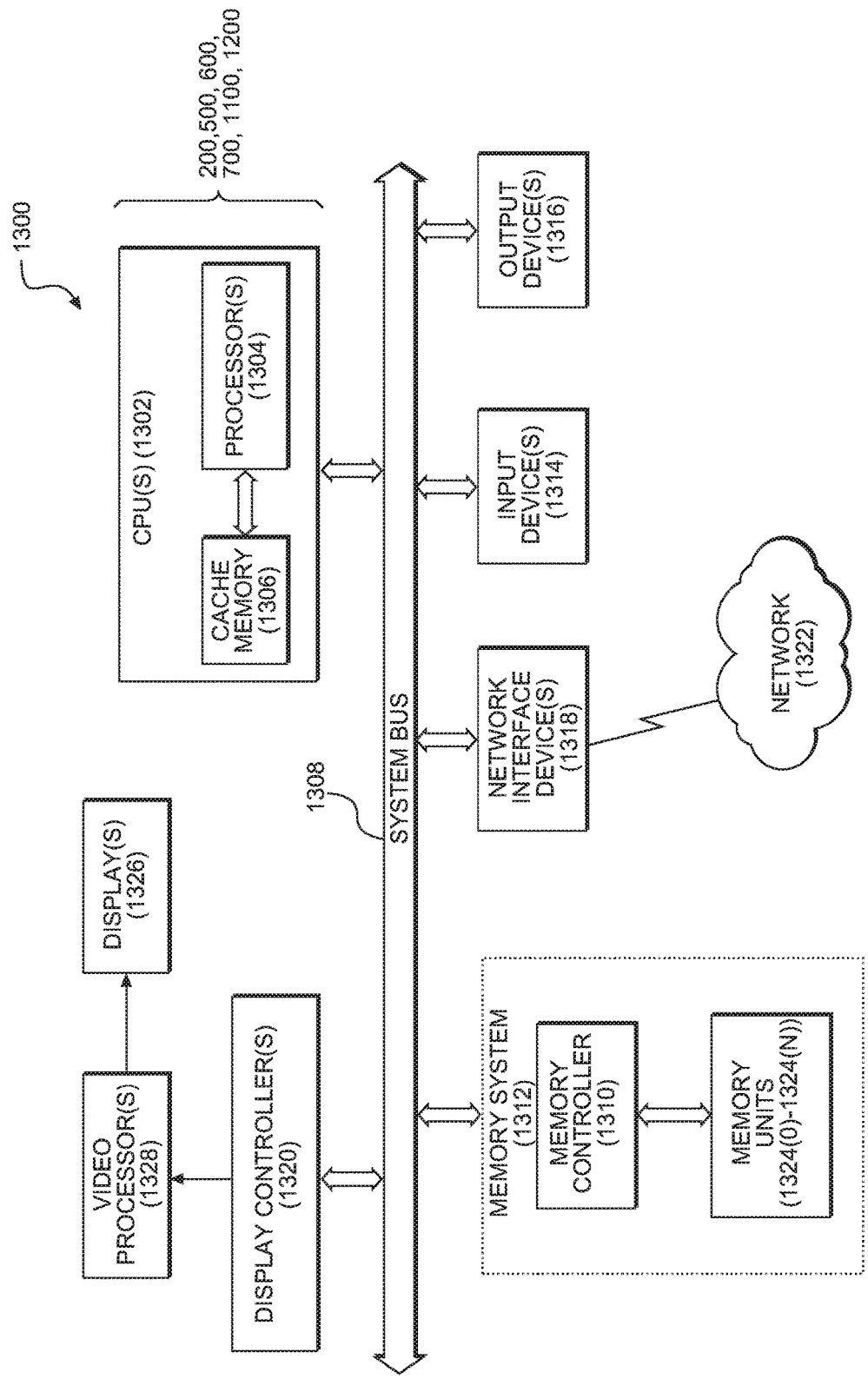
FIG. 13 is a block diagram of an exemplary processor-based system that can include elements employing the bi-stable SRAM bit cells of FIGS. 2, 5A-8, 11, and 12.

In this regard, FIG. 13 illustrates an example of a processor-based system 1300 that can include elements employing the bi-stable SRAM bit cells 200, 500, 600, 700, 800, 1100, and 1200 of FIGS. 2, 5A-8, 11, and 12, respectively. In this example, the processor-based system 1300 includes one or more central processing units (CPUs) 1302, each including one or more processors 1304. The CPU(s) 1302 may have cache memory 1306 coupled to the processor(s) 1304 for rapid access to temporarily stored data. The CPU(s) 1302 is coupled to a system bus 1308 and can intercouple master and slave devices included in the processor-based system 1300. As is well known, the CPU(s) 1302 communicates with these other devices by exchanging address, control, and data information over the system bus 1308. For example, the CPU(s) 1302 can communicate bus transaction requests to a memory controller 1310 as an example of a slave device. Although not illustrated in FIG. 13, multiple system buses 1308 could be provided, wherein each system bus 1308 constitutes a different fabric.

Other master and slave devices can be connected to the system bus 1308. As illustrated in FIG. 13, these devices can include a memory system 1312, one or more input devices 1314, one or more output devices 1316, one or more network interface devices 1318, and one or more display controllers 1320, as examples. The input device(s) 1314 can include any type of input device, including, but not limited to, input keys, switches, voice processors, etc. The output device(s) 1316 can include any type of output device, including, but not limited to, audio, video, other visual indicators, etc. The network interface device(s) 1318 can be any device configured to allow exchange of data to and from a network 1322. The network 1322 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1318 can be configured to support any type of communications protocol desired. The memory system 1312 can include one or more memory units 1324(0)-1324(N).

The CPU(s) 1302 may also be configured to access the display controller(s) 1320 over the system bus 1308 to control information sent to one or more displays 1326. The display controller(s) 1320 sends information to the display(s) 1326 to be displayed via one or more video processors 1328, which process the information to be displayed into a format suitable for the display(s) 1326. The display(s) 1326 can include any type of display, including, but not limited to, a cathode ray tube (CRT), a liquid crystal display (LCD), a plasma display, a light emitting diode (LED) display, etc.

Figure 14:
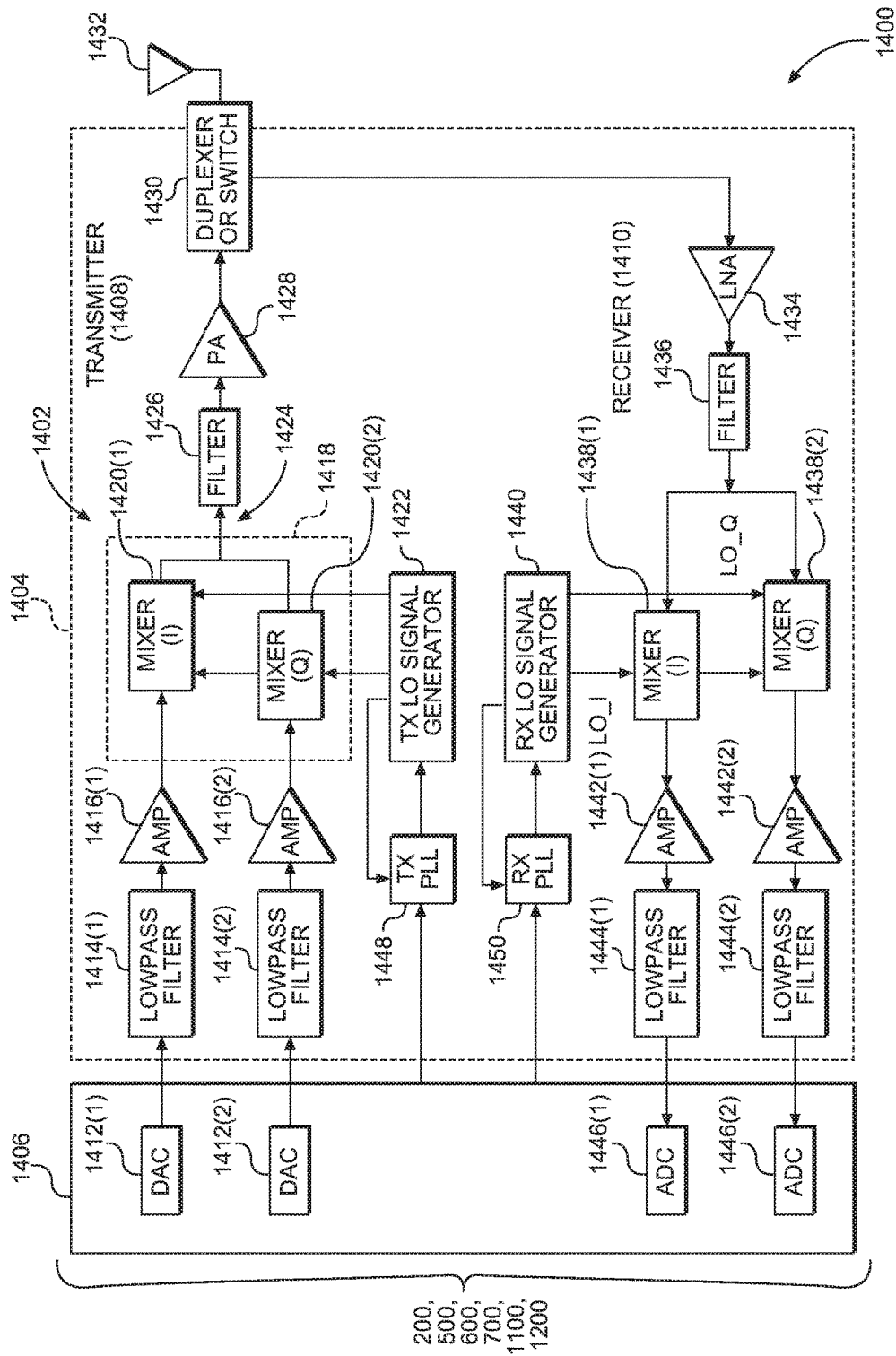
FIG. 14 is a block diagram of an exemplary wireless communications device that includes radio frequency (RF) components formed in an integrated circuit (IC), wherein the RF components can include elements employing the bi-stable SRAM bit cells of FIGS. 2, 5A-8, 11, and 12.

FIG. 14 illustrates an exemplary wireless communications device 1400 that includes radio frequency (RF) components formed in an integrated circuit (IC) 1402, wherein the RF components can include elements employing the employing the bi-stable SRAM bit cells 200, 500, 600, 700, 800, 1100, and 1200 of FIGS. 2, 5A-8, 11, and 12, respectively. In this regard, the wireless communications device 1400 may be provided in the IC 1402. The wireless communications device 1400 may include or be provided in any of the above referenced devices, as examples. As shown in FIG. 14, the wireless communications device 1400 includes a transceiver 1404 and a data processor 1406. The data processor 1406 may include a memory to store data and program codes. The transceiver 1404 includes a transmitter 1408 and a receiver 1410 that support bi-directional communication. In general, the wireless communications device 1400 may include any number of transmitters and/or receivers for any number of communication systems and frequency bands. All or a portion of the transceiver 1404 may be implemented on one or more analog ICs, RF ICs (RFICs), mixed-signal ICs, etc.

A transmitter 1408 or a receiver 1410 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for the receiver 1410. In the direct-conversion architecture, a signal is frequency-converted between RF and baseband in one stage. The super-heterodyne and direct-conversion architectures may use different circuit blocks and/or have different requirements. In the wireless communications device 1400 in FIG. 14, the transmitter 1408 and the receiver 1410 are implemented with the direct-conversion architecture.

In the transmit path, the data processor 1406 processes data to be transmitted and provides I and Q analog output signals to the transmitter 1408. In the exemplary wireless communications device 1400, the data processor 1406 includes digital-to-analog-converters (DACs) 1412(1), 1412(2) for converting digital signals generated by the data processor 1406 into the I and Q analog output signals, e.g., I and Q output currents, for further processing.

Within the transmitter 1408, lowpass filters 1414(1), 1414(2) filter the I and Q analog output signals, respectively, to remove undesired signals caused by the prior digital-to-analog conversion. Amplifiers (AMP) 1416(1), 1416(2) amplify the signals from the lowpass filters 1414(1), 1414(2), respectively, and provide I and Q baseband signals. An upconverter 1418 upconverts the I and Q baseband signals with I and Q transmit (TX) local oscillator (LO) signals through mixers 1420(1), 1420(2) from a TX LO signal generator 1422 to provide an upconverted signal 1424. A filter 1426 filters the upconverted signal 1424 to remove undesired signals caused by the frequency upconversion as well as noise in a receive frequency band. A power amplifier (PA) 1428 amplifies the upconverted signal 1424 from the filter 1426 to obtain the desired output power level and provides a transmit RF signal. The transmit RF signal is routed through a duplexer or switch 1430 and transmitted via an antenna 1432.

In the receive path, the antenna 1432 receives signals transmitted by base stations and provides a received RF signal, which is routed through the duplexer or switch 1430 and provided to a low noise amplifier (LNA) 1434. The duplexer or switch 1430 is designed to operate with a specific receive (RX)-to-TX duplexer frequency separation, such that RX signals are isolated from TX signals. The received RF signal is amplified by the LNA 1434 and filtered by a filter 1436 to obtain a desired RF input signal. Down-conversion mixers 1438(1), 1438(2) mix the output of the filter 1436 with I and Q RX LO signals (i.e., LO_I and LO_Q) from an RX LO signal generator 1440 to generate I and Q baseband signals. The I and Q baseband signals are amplified by amplifiers (AMP) 1442(1), 1442(2) and further filtered by lowpass filters 1444(1), 1444(2) to obtain I and Q analog input signals, which are provided to the data processor 1406. In this example, the data processor 1406 includes analog-to-digital-converters (ADCs) 1446(1), 1446(2) for converting the analog input signals into digital signals to be further processed by the data processor 1406.

In the wireless communications device 1400 of FIG. 14, the TX LO signal generator 1422 generates the I and Q TX LO signals used for frequency upconversion, while the RX LO signal generator 1440 generates the I and Q RX LO signals used for frequency downconversion. Each LO signal is a periodic signal with a particular fundamental frequency. A TX phase-locked loop (PLL) circuit 1448 receives timing information from the data processor 1406 and generates a control signal used to adjust the frequency and/or phase of the TX LO signals from the TX LO signal generator 1422. Similarly, an RX PLL circuit 1450 receives timing information from the data processor 1406 and generates a control signal used to adjust the frequency and/or phase of the RX LO signals from the RX LO signal generator 1440.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A bi-stable static random access memory (SRAM) bit cell, comprising:
   a substrate;
   a well region formed in the substrate;
   a source region formed adjacent to the well region, wherein a first bipolar junction transistor (BJT) is formed that comprises a base corresponding to the well region, a collector corresponding to the substrate, and an emitter corresponding to the source region;
   a drain region formed adjacent to the well region a distance from the source region, wherein a second BJT is formed that comprises a base corresponding to the well region, a collector corresponding to the substrate, and an emitter corresponding to the drain region;
   a gate region formed over the well region between the source region and the drain region;
   a base tap region formed adjacent to the well region;
   a collector tap region formed adjacent to the substrate;
   a first shallow trench isolation (STI) region formed in the substrate adjacent to a first side of the well region and the source region, wherein a bottom surface of the first STI region is lower in the substrate than a bottom surface of the well region;
   a second STI region formed in the substrate between the base tap region and the collector tap region and adjacent to a second side of the well region and the drain region, wherein a bottom surface of the second STI region is lower in the substrate than the bottom surface of the well region; and
   a third STI region formed in the substrate between the drain region and the base tap region, wherein a bottom surface of the third STI region is higher in the well region than the bottom surface of the well region.

2. The bi-stable SRAM bit cell of claim 1, wherein:
   the source region is electrically coupled to a source line;
   the drain region is electrically coupled to a bit line;
   the gate region is electrically coupled to a word line;
   the base tap region is electrically coupled to a base tap line; and
   the collector tap region is electrically coupled to a collector tap line.

3. The bi-stable SRAM bit cell of claim 1, wherein:
   the substrate comprises a P-type material;
   the well region is doped with an N-type material;
   the source region is formed from the P-type material;
   the drain region is formed from the P-type material;
   the base tap region is formed from the N-type material; and
   the collector tap region is formed from the P-type material.

4. The bi-stable SRAM bit cell of claim 3, wherein:
   the source region is formed from a material selected from the group consisting of: silicon-germanium (SiGe) and silicon (Si);
   the drain region is formed from a material selected from the group consisting of: silicon-germanium (SiGe) and silicon (Si);
   the base tap region is formed from a material selected from the group consisting of:
   silicon-carbide (SiC) and silicon (Si); and
   the collector tap region is formed from a material selected from the group consisting of:
   silicon-germanium (SiGe) and silicon (Si).

5. The bi-stable SRAM bit cell of claim 3, wherein the well region comprises a Fin comprising a top surface higher than a top surface of the first STI region, a top surface of the second STI region, and a top surface of the third STI region.

6. The bi-stable SRAM bit cell of claim 1, further comprising a second well region disposed between the well region and the substrate, wherein:
   the substrate comprises a P-type material;
   the well region is doped with the P-type material;
   the second well region is doped with an N-type material;
   the source region is formed from the N-type material;
   the drain region is formed from the N-type material;
   the base tap region is formed from the P-type material; and
   the collector tap region is formed from the P-type material.

7. The bi-stable SRAM bit cell of claim 5, wherein:
   the source region is formed from a material selected from the group consisting of: silicon-carbide (SiC) and silicon (Si);
   the drain region is formed from a material selected from the group consisting of: silicon-carbide (SiC) and silicon (Si);
   the base tap region is formed from a material selected from the group consisting of:
   silicon-germanium (SiGe) and silicon (Si); and
   the collector tap region is formed from a material selected from the group consisting of:
   silicon-carbide (SiC) and silicon (Si).

8. The bi-stable SRAM bit cell of claim 6, wherein the well region comprises a Fin comprising a top surface higher than a top surface of the first STI region, a top surface of the second STI region, and a top surface of the third STI region.

9. The bi-stable SRAM bit cell of claim 1, wherein the gate region comprises:
   a high-k dielectric oxide layer disposed over the well region; and
   a metal layer disposed over the high-k dielectric oxide layer.

10. The bi-stable SRAM bit cell of claim 1 integrated into an integrated circuit (IC).

11. The bi-stable SRAM bit cell of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

12. A static random access memory (SRAM) data array, comprising a plurality of bi-stable SRAM bit cells organized into a plurality of SRAM bit cell rows and a plurality of SRAM bit cell columns, wherein each bi-stable SRAM bit cell of the plurality of bi-stable SRAM bit cells corresponds to an SRAM bit cell row and an SRAM bit cell column, and comprises:
   a substrate;
   a well region formed in the substrate;
   a source region formed adjacent to the well region, wherein a first bipolar junction transistor (BJT) is formed that comprises a base corresponding to the well region, a collector corresponding to the substrate, and an emitter corresponding to the source region;
   a drain region formed adjacent to the well region a distance from the source region, wherein a second BJT is formed that comprises a base corresponding to the well region, a collector corresponding to the substrate, and an emitter corresponding to the drain region;
   a gate region formed over the well region between the source region and the drain region;
   a base tap region formed adjacent to the well region;
   a collector tap region formed adjacent to the substrate;
   a first shallow trench isolation (STI) region formed in the substrate adjacent to a first side of the well region and the source region, wherein a bottom surface of the first STI region is lower in the substrate than a bottom surface of the well region;
   a second STI region formed in the substrate between the base tap region and the collector tap region and adjacent to a second side of the well region and the drain region, wherein a bottom surface of the second STI region is lower in the substrate than the bottom surface of the well region; and
   a third STI region formed in the substrate between the drain region and the base tap region, wherein a bottom surface of the third STI region is higher in the well region than the bottom surface of the well region.

13. The SRAM data array of claim 12, wherein:
   the source region of each bi-stable SRAM bit cell is electrically coupled to a source line;
   the drain region of each bi-stable SRAM bit cell is electrically coupled to a bit line;
   the gate region of each bi-stable SRAM bit cell is electrically coupled to a word line; and
   the collector tap region of each bi-stable SRAM bit cell is electrically coupled to a collector tap line.

14. The SRAM data array of claim 12, wherein:
   the substrate of each bi-stable SRAM bit cell comprises a P-type material;
   the well region of each bi-stable SRAM bit cell is doped with an N-type material;
   the source region of each bi-stable SRAM bit cell is formed from the P-type material;
   the drain region of each bi-stable SRAM bit cell is formed from the P-type material;
   the base tap region of each bi-stable SRAM bit cell is formed from the N-type material; and
   the collector tap region of each bi-stable SRAM bit cell is formed from the P-type material.

15. The SRAM data array of claim 14, wherein the well region of each bi-stable SRAM bit cell comprises a Fin comprising a top surface higher than a top surface of the first STI region, a top surface of the second STI region, and a top surface of the third STI region.

16. The SRAM data array of claim 12, wherein each bi-stable SRAM bit cell further comprises a second well region disposed between the well region and the substrate, wherein:
   the substrate comprises a P-type material;
   the well region is doped with the P-type material;
   the second well region is doped with an N-type material;
   the source region is formed from the N-type material;
   the drain region is formed from the N-type material;
   the base tap region is formed from the P-type material; and
   the collector tap region is formed from the P-type material.

17. The SRAM data array of claim 16, wherein the well region of each bi-stable SRAM bit cell comprises a Fin comprising a top surface higher than a top surface of the first STI region, a top surface of the second STI region, and a top surface of the third STI region.

18. The SRAM data array of claim 12, wherein the gate region of each bi-stable SRAM bit cell comprises:
   a high-k dielectric oxide layer disposed over the well region; and
   a metal layer disposed over the high-k dielectric oxide layer.

19. A method for manufacturing a bi-stable static random access memory (SRAM) bit cell, comprising:
   forming a first shallow trench isolation (STI) region, a second STI region, and a third STI region, wherein a bottom surface of the first STI region and a bottom surface of the second STI region is lower in a substrate than a bottom surface of the third STI region;
   doping the substrate to form a well region such that a bottom surface of the well region is higher in the substrate than the bottom surfaces of the first STI region and the second STI region, and lower in the substrate than the bottom surface of the third STI region;
   forming a gate region over the well region between the first STI region and the third STI region;
   forming a source region adjacent to the well region between the first STI region and the gate region, wherein a first bipolar junction transistor (BJT) is formed that comprises a base corresponding to the well region, a collector corresponding to the substrate, and an emitter corresponding to the source region;
   forming a drain region adjacent to the well region between the third STI region and the gate region, wherein a second BJT is formed that comprises a base corresponding to the well region, a collector corresponding to the substrate, and an emitter corresponding to the drain region;
   forming a base tap region adjacent to the well region between the second STI region and the third STI region; and
   forming a collector tap region adjacent to the substrate adjacent to the second STI region.

20. The method of claim 19, wherein forming the first STI region, the second STI region, and the third STI region comprises:
   growing a pad oxide on the substrate;

depositing a hard mask layer over the pad oxide;
depositing a photoresist layer over the hard mask layer having a pattern corresponding to the first STI region, the second STI region, and the third STI region;
etching the hard mask layer and the pad oxide according to the pattern of the photoresist layer;
removing the photoresist layer;
etching the substrate to form the first STI region, the second STI region, and the third STI region such that the bottom surface of the first STI region and the bottom surface of the second STI region is lower in the substrate than the bottom surface of the third STI region;
filling the first STI region, the second STI region, and the third STI region with an STI oxide; and
removing excess STI oxide using chemical mechanical planarization (CMP);
removing the hard mask layer and the pad oxide.

* * * * *